United States Patent
Meyers

(10) Patent No.: US 9,171,982 B2
(45) Date of Patent: Oct. 27, 2015

(54) INTEGRATED JUMPERS FOR BUILDING INTEGRABLE PHOTOVOLTAIC MODULES

(75) Inventor: Michael C. Meyers, San Jose, CA (US)

(73) Assignee: APOLLO PRECISION (KUNMING) YUANHONG LIMITED, Kunming, Yunan (CN)

( * ) Notice: Subject to any disclaimer, the term of this patent is extended or adjusted under 35 U.S.C. 154(b) by 421 days.

(21) Appl. No.: 13/324,902

(22) Filed: Dec. 13, 2011

(65) Prior Publication Data

US 2013/0146125 A1   Jun. 13, 2013

(51) Int. Cl.
| | |
|---|---|
| H01L 31/042 | (2014.01) |
| H01L 31/05 | (2014.01) |
| H01L 31/04 | (2014.01) |
| H01R 31/08 | (2006.01) |
| B21D 39/03 | (2006.01) |
| B23P 11/00 | (2006.01) |
| B23P 15/00 | (2006.01) |
| H01R 12/79 | (2011.01) |
| H01R 13/52 | (2006.01) |
| H02S 40/36 | (2014.01) |
| H01R 103/00 | (2006.01) |
| H02S 20/23 | (2014.01) |

(52) U.S. Cl.
CPC ............... *H01L 31/05* (2013.01); *H01R 12/79* (2013.01); *H01R 13/5219* (2013.01); *H02S 40/36* (2014.12); *H01R 2103/00* (2013.01); *H02S 20/23* (2014.12); *Y02B 10/12* (2013.01); *Y02B 10/14* (2013.01); *Y02E 10/50* (2013.01); *Y10T 29/49355* (2015.01); *Y10T 29/49826* (2015.01)

(58) Field of Classification Search
CPC .................. H01L 2224/73265; H01L 31/05; H01L 31/02013; H01L 31/02021; H01L 31/04; F21V 23/06; Y02B 10/12; Y02B 10/14; Y02E 10/50; H02S 20/23; H02S 20/25; H02S 40/36; H01R 13/5219; H01R 12/79; H01R 2103/00; Y10T 29/49826; Y10T 29/49355
USPC ................................... 136/243–265
See application file for complete search history.

(56) References Cited

U.S. PATENT DOCUMENTS

| | | | |
|---|---|---|---|
| 5,155,006 A * | 10/1992 | Goto et al. .................... 430/264 |
| 6,840,799 B2 * | 1/2005 | Yoshikawa et al. ........... 439/502 |
| 7,297,867 B2 * | 11/2007 | Nomura et al. ............... 136/251 |
| 7,713,089 B2 * | 5/2010 | Faust et al. ............... 439/620.21 |
| 7,762,832 B2 * | 7/2010 | Minnick ....................... 439/374 |
| 2008/0149170 A1 * | 6/2008 | Hanoka ......................... 136/251 |
| 2009/0242015 A1 * | 10/2009 | Wattman et al. .............. 136/251 |
| 2011/0132427 A1 * | 6/2011 | Kalkanoglu et al. .......... 136/244 |

* cited by examiner

*Primary Examiner* — Jennifer K. Michener
*Assistant Examiner* — Mayla Gonzalez Ramos
(74) *Attorney, Agent, or Firm* — Weaver Austin Villeneuve and Sampson LLP

(57) ABSTRACT

Provided are novel building integrable photovoltaic (BIPV) modules having integrated jumpers for interconnecting similar modules in adjacent rows. An integrated jumper is provided on a back side of the photovoltaic portion of the module and includes at least two interconnected jumper contact points. The module also has two connectors provided on the front side of its flap portion. Each connector has at least one connector contact point connected to one or more photovoltaic cells of the module. When a module is positioned over flap portions of two other modules previously installed in an adjacent row, the two jumper contact points on the back side of this new module make electrical connections to the two connector contact points on the front side of the installed modules. In turn, these connections interconnect the photovoltaic cells of the two modules without any need for additional connectors or operations.

18 Claims, 16 Drawing Sheets

INTEGRATED JUMPERS FOR BUILDING INTEGRABLE PHOTOVOLTAIC MODULES

BACKGROUND

Photovoltaic cells are widely used for electricity generation, with one or more photovoltaic cells typically sealed within a module. Multiple modules may be arranged into photovoltaic arrays used to convert solar energy into electricity by the photovoltaic effect. Arrays can be installed on building rooftops and are used to provide electricity to the buildings and to the general electrical grid. Various electrical connections need to be provided between modules and other electrical components of the array.

SUMMARY

Provided are novel building integrable photovoltaic (BIPV) modules having integrated jumpers for interconnecting similar modules in adjacent rows. In some embodiments, an integrated jumper is provided on a back side of the photovoltaic portion of the BIPV module and includes at least two interconnected jumper contact points. The BIPV module can also have two connectors provided on the front side of its flap portion. Each connector has at least one connector contact point connected to one or more photovoltaic cells of the module. During installation, jumper contact points on the back side of a BIPV module can be electrically connected to connector contact points on front sides of previously installed BIPV modules in an adjacent row. These connections can interconnect the photovoltaic cells of the modules without additional connectors or installation operations.

In certain embodiments, a BIPV module for installation into a photovoltaic array includes a photovoltaic portion, flap portion, first connector, second connector, and integrated jumper. The photovoltaic portion includes one or more photovoltaic cells having a first edge and a second edge opposite to the first edge. The flap portion is attached to the photovoltaic portion along the first edge. The first connector is attached to the front side of the flap portion adjacent to the first edge and includes a first connector contact point. The second connector is attached to the front side of the flap portion adjacent to the first edge and includes a second connector contact point. The first and second connector contact points are electrically connected to the one or more photovoltaic cells and have different polarities. The integrated jumper is attached to the back side of the photovoltaic portion adjacent to the second edge. The jumper includes two interconnected jumper contact points configured to establish electrical connections with two connector contact points of two adjacent BIPV modules, which are provided in an adjacent row during installation of the photovoltaic array.

In certain embodiments, the first and second connectors are positioned adjacent to opposite ends of the first edge. The integrated jumper may be positioned substantially in a middle of the second edge. The first connector may include a socket enclosing the first connector contact point. This socket may extend substantially perpendicular to the front side of the flap portion. In other embodiments, the first connector includes a socket enclosing the first connector contact point, and this socket extends substantially parallel to the front side of the flap portion. The second connector may also include such sockets extending either substantially parallel or perpendicular to the front side of the flap portion. The first connector contact point may be electrically connected to the two interconnected jumper contact points of the integrated jumper.

In certain embodiments, the integrated jumper includes interlocking features for interlocking with connectors of the two adjacent BIPV modules. Such adjacent BIPV modules are provided in the adjacent row during installation of the photovoltaic array. The material of the integrated jumper may be substantially more flexible than the material of the back side of the photovoltaic portion. For example, the integrated jumper may be made from one or more of the following materials: polyethylene, polypropylene, thermoplastic olefins, thermoplastic rubber, thermoplastic elastomer, ethylene propylene diene monomer, fluoro-elastomer, and thermoplastic vulcanizate. In certain embodiments, the two interconnected jumper contact points are movable with respect to each other at least along the second edge. In the same or other embodiments, the first connector is movable with respect to the second connector at least along the first edge. These movable features may be used to accommodate stresses generated by differences in coefficient of thermal expansion. In certain embodiment, the first connector contact point includes a louvered metal strip positioned within a cavity of the first connector.

In certain embodiments, the integrated jumper also includes a third jumper contact point that is electrically connected to the first connector contact point of the first connector. The third jumper contact point may be electrically insulated from the other two interconnected jumper contact points. The first connector may include a first return connector contact point, while the second connector may include a second return connector contact point. These two return connector contact points may be electrically interconnected. In certain embodiments, the integrated jumper includes two return jumper contact points electrically connected to each other and configured to establish electrical connections to two return connector contact points of the two adjacent BIPV modules provided in the adjacent row during installation of the photovoltaic array. These two return jumper contact points may be electrically connected to the third jumper contact point. In certain embodiments, the first return connector contact point may be electrically connected to the first connector contact point.

Provided also is a photovoltaic array that includes a first row including two BIPV modules and a second row positioned adjacent to the first row and including a BIPV module including an integrated jumper having two interconnected jumper contact points. Each of the two BIPV modules in the first row include a connector having a connector contact point electrically connected to one or more photovoltaic cells of that BIPV module. The two interconnected jumper contact points of the BIPV module in the second row are electrically connected to the connector contact points of the two BIPV modules in the first row such that the one or more photovoltaic cells of the two BIPV modules becomes electrically connected.

In certain embodiments, the photovoltaic array also includes an additional BIPV module positioned in the second row. This additional BIPV module includes an integrated jumper having two interconnected jumper contact points, one of which may be electrically connected to a separate connector contact point of one of the two BIPV modules. A first connector contact point of this additional BIPV module may be electrically connected to the connector contact point of the BIPV module in the second row. A second connector contact point of this additional BIPV module may be electrically connected to the two interconnected jumper contact points of the additional BIPV module.

Also provide is a method of installing a photovoltaic array. In certain embodiments, the method involves forming a first row including two BIPV modules. Each of these two BIPV modules may include a connector having a connector contact point electrically connected to one or more photovoltaic cells of that BIPV module. The method may also involve positioning a BIPV module in a second row adjacent to the first row. This new BIPV module includes an integrated jumper having two interconnected jumper contact points. During positioning of this new BIPV module in the second row, the two interconnected jumper contact points form electrical connections with the connector contact points of the two BIPV modules in the first row such that the one or more photovoltaic cells of the two BIPV modules become electrically connected.

The method may also involve installing one or more field jumpers to interconnect connector contact points of two or more BIPV modules in the second row. In certain embodiments, the method involves positioning a second BIPV module in the second row. The second BIPV module includes an integrated jumper having two interconnected jumper contact points and a connector having a connector contact point electrically connected to one or more photovoltaic cells of the second BIPV module. During positioning of this second BIPV module in the second row, a first one of the two interconnected jumper contact points forms electrical connections with the connector contact point of one of the two BIPV modules in the first row. Furthermore, a second one of the two interconnected jumper contact points of the second BIPV module is electrically connected to the connector contact point of the second BIPV module. In certain embodiments, the method also involves installing a field jumper to electrically connect the two interconnected jumper contact points to a third interconnected jumper contact point.

These and other embodiments are described further below with reference to the figures.

DETAILED DESCRIPTION OF EXAMPLE EMBODIMENTS

Figure 1:
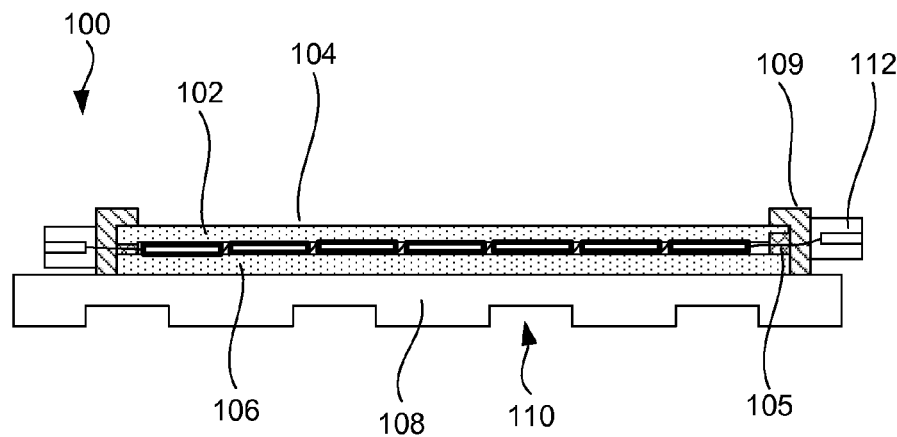
FIG. 1 is a schematic cross-sectional side view of a BIPV module, in accordance with certain embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

BIPV modules are installed on building structures to generate electricity and to protect the building structure from the environment. BIPV modules are often formed into large arrays of mechanically and electrically interconnected modules. An array may include one or more groups of BIPV modules forming in electrical strings or loops. All modules in a string are connected in series with one another. The string has two ends which may be connected to an inverter or some other electrical component of the array. Each string includes multiple modules, and often the same number of modules is used in each string. Electrical connections with the string are made within each row and often across two or more rows. While external separate connectors have been proposed for this purpose, this approach requires additional components, operations, and often different professionals to be involved in installation and repair. Separate components need to be independently ordered and stocked. They tend to get lost during installation and cause additional complexities during configuring and installing photovoltaic arrays. For example, each separate component of the array (including BIPV modules) may need to be aligned with all other adjacent components, which quickly becomes very laborious with the addition of new separate components. Furthermore, external separate connectors may physically separate from BIPV modules during operation (e.g., under constant thermal cycling on a rooftop) and cause losses of electrical connections.

Provided are novel BIPV modules having integrated jumpers for interconnecting other modules in an adjacent row and methods of installing photovoltaic strings and arrays using these modules. In addition to interconnecting the two modules in an adjacent row, these novel BIPV modules may be used for providing electrical connections between multiple rows in the array and/or to provide return pathways along the rows and/or across the rows. All electrical components of the module, including integrated jumpers and connectors, are parts of the module, with all internal electrical connections and mechanical integration provided during fabrication of the BIPV modules. All or most of the electrical connections in the array do require additional external components but are provided simply by positioning other modules. Field jumpers may be used in some embodiments, for example, for making electrical connections across an end row of modules and/or reconfiguring row-end modules.

Furthermore, integrated jumpers may be used with other features of the BIPV modules for mechanical alignment of the BIPV modules during installation and for maintaining this alignment later during operation. The alignment may be provided in one or both directions (i.e., along rows of the BIPV modules and/or in between rows). Module alignment may be important to preserve the electrical and mechanical integrity of the array over its operating life.

In some embodiments, an integrated jumper is provided on a back side of a photovoltaic portion of a BIPV module and includes at least two interconnected jumper contact points. Additional jumper contact points may be used in some embodiments as described below. The BIPV module also can include two connectors provided on a front side of a flap portion, each having at least one connector contact point electrically connected to one or more photovoltaic cells of the module. The location of the two interconnected jumper contact points can correspond to the location of the connector contact points on the two connectors to provide connections between respective jumper and connector contact points of multiple BIPV modules during installation.

In some embodiments, when a photovoltaic portion of a first BIPV module in a first row is positioned over the flaps of two other BIPV modules positioned in an adjacent row, the two interconnected jumper contact points of the first BIPV module can make an electrical connection to two adjacent connector contact points of the other BIPV modules. This connection effectively interconnects the photovoltaic cells of the two other BIPV modules. No separate connection operations or components are needed. In this manner, integrated jumpers of BIPV modules in one row can be used for interconnecting adjacent connector contact points of BIPV modules in an adjacent row (e.g., BIPV modules in a lower row in the sloped roof configuration).

Two adjacent connector contact points of BIPV modules in a row generally have a different polarity. In certain embodiments, the BIPV modules described herein have integrated return paths, which can eliminate a need for different types of modules having different polarity orientations.

An overview BIPV modules and electrical connectors that may be used in accordance with embodiments described herein is presented below with reference to FIGS. 1-8, with further description of integrated jumpers described below with respect to FIGS. 9A-13. FIG. 1 is a schematic cross-sectional end view (line 1—1 in FIG. 2 indicates the position of this cross-section) of a BIPV module 100, in accordance with certain embodiments. BIPV module 100 may have one or more photovoltaic cells 102 that are electrically interconnected. Photovoltaic cells 102 may be interconnected in parallel, in series, or in various combinations of these. Examples of photovoltaic cells include copper indium gallium selenide (CIGS) cells, cadmium-telluride (Cd—Te) cells, amorphous silicon (a-Si) cells, micro-crystalline silicon cells, crystalline silicon (c-Si) cells, gallium arsenide multi junction cells, light adsorbing dye cells, organic polymer cells, and other types of photovoltaic cells.

Photovoltaic cell 102 has a photovoltaic layer that generates a voltage when exposed to sunlight. In certain embodiments, the photovoltaic layer includes a semiconductor junction. The photovoltaic layer may be positioned adjacent to a back conductive layer, which, in certain embodiments, is a thin layer of molybdenum, niobium, copper, and/or silver. Photovoltaic cell 102 may also include a conductive substrate, such as stainless steel foil, titanium foil, copper foil, aluminum foil, or beryllium foil. Another example includes a conductive oxide or metallic deposition over a polymer film, such as polyimide. In certain embodiments, a substrate has a thickness of between about 2 mils and 50 mils (e.g., about 10 mils), with other thicknesses also in the scope. Photovoltaic cell 102 may also include a top conductive layer. This layer typically includes one or more transparent conductive oxides (TCO), such as zinc oxide, aluminum-doped zinc oxide (AZO), indium tin oxide (ITO), and gallium doped zinc oxide. A typical thickness of a top conductive layer is between about 100 nanometers to 1,000 nanometers (for example, between about 200 nanometers and 800 nanometers), with other thicknesses within the scope.

In certain embodiments, photovoltaic cells 102 are interconnected using one or more current collectors (not shown). The current collector may be attached and configured to collect electrical currents from the top conductive layer. The current collector may also provide electrical connections to adjacent cells as further described with reference to of FIG. 5, below. The current collector includes a conductive component (e.g., an electrical trace or wire) that contacts the top conductive layer (e.g., a TCO layer). The current collector may further include a top carrier film and/or a bottom carrier film, which may be made from transparent insulating materials to prevent electrical shorts with other elements of the cell and/or module. In certain embodiments, a bus bar is attached directly to the substrate of a photovoltaic cell. A bus bar may also be attached directly to the conductive component of the current collector. For example, a set of photovoltaic cells may be electrically interconnected in series with multiple current collectors (or other interconnecting wires). One bus bar may be connected to a substrate of a cell at one end of this set, while another bus bar may be connected to a current collector at another end.

Photovoltaic cells 102 may be electrically and environmentally insulated between a front sheet 104 (i.e., the light incident sheet) and a back sheet 106 (i.e., the building structure facing sheet), which may be referred to as sealing sheets. Examples of such sheets include glass, polyethylene, polyethylene terephthalate (PET), polypropylene, polybutylene, polybutylene terephthalate (PBT), polyphenylene oxide (PPO), polyphenylene sulfide (PPS) polystyrene, polycarbonates (PC), ethylene-vinyl acetate (EVA), fluoropolymers (e.g., polyvinyl fluoride (PVF), polyvinylidene fluoride (PVDF), ethylene-terafluoethylene (ETFE), fluorinated ethylene-propylene (FEP), perfluoroalkoxy (PFA) and polychlorotrifluoroethane (PCTFE)), acrylics (e.g., poly(methyl methacrylate)), silicones (e.g., silicone polyesters), and/or polyvinyl chloride (PVC), as well as multilayer laminates and co-extrusions of these materials. A typical thickness of a sealing sheet is between about 5 mils and 100 mils or, more specifically, between about 10 mils and 50 mils. In certain embodiments, a back sheet includes a metallized layer to improve water permeability characteristics of the sheet. For example, a metal foil may be positioned in between two insulating layers to form a composite back sheet. In certain embodiments, a module has an encapsulant layer positioned between one or both sheets 104, 106 and photovoltaic cells 102. Examples of encapsulant layer materials include non-olefin thermoplastic polymers or thermal polymer olefin (TPO), such as polyethylene (e.g., a linear low density polyethylene), polypropylene, polybutylene, polyethylene terephthalate (PET), polybutylene terephthalate (PBT), polystyrene, polycarbonates, fluoropolymers, acrylics, ionomers, silicones, and combinations thereof.

BIPV module 100 may also include an edge seal 105 that surrounds photovoltaic cells 102. Edge seal 105 may be used to secure front sheet 104 to back sheet 106 and/or to prevent moisture from penetrating in between these two sheets. Edge seal 105 may be made from certain organic or inorganic materials that have low inherent water vapor transmission rates (WVTR) (e.g., typically less than 1-2 g/m2/day). In certain embodiments, edge seal 105 is configured to absorb moisture from inside the module in addition to preventing moisture ingression into the module. For example, a butyl-rubber containing moisture getter or desiccant may be added to edge seal 105. In certain embodiments, a portion of edge seal 105 that contacts electrical components (e.g., bus bars) of BIPV module 100 is made from a thermally resistant polymeric material. Various examples of thermally resistant materials and RTI ratings are further described below.

BIPV module 100 may also have a support sheet 108 attached to back sheet 106. The attachment may be provided by a support edge 109, which, in certain embodiments, is a part of support sheet 108. Support sheets may be made, for example, from rigid polymer materials such as polyethylene terephthalate (e.g., RYNITE® available from Du Pont in Wilmington, Del.), polybutylene terephthalate (e.g., Crastin® also available from Du Pont), polyphenylene sulfide (e.g., Ryton® available from Chevron Phillips in The Woodlands, Tex.), polyamide (e.g., Zytel® available from DuPont), polycarbonate, and polypropylene. In other embodiments, support sheet 108 may be attached to back sheet 106 without a separate support edge 109 or other separate supporting element. For example, support sheet 108 and back sheet 106 may be laminated together, or support sheet 108 may be formed (e.g., by injection molding) over back sheet 106. In other embodiments, back sheet 106 serves as a support sheet 108. In this case, the same element used to seal photovoltaic cells 102 may be positioned over and contact a roof structure (not shown). Support sheet 108 may have one or more ventilation channels 110 to allow for air to flow between BIPV module 100 and a building surface (e.g., a roof-deck or a water resistant underlayment/membrane on top of the roof deck). Ventilation channels 110 may be used for cooling BIPV module 100 during its operation. For example, it has been found that each 1° C. of heating from an optimal operating temperature of a typical Copper indium gallium (di) selenide CIGS cell causes an efficiency loss of about 0.33% to 0.5%.

Figure 2:
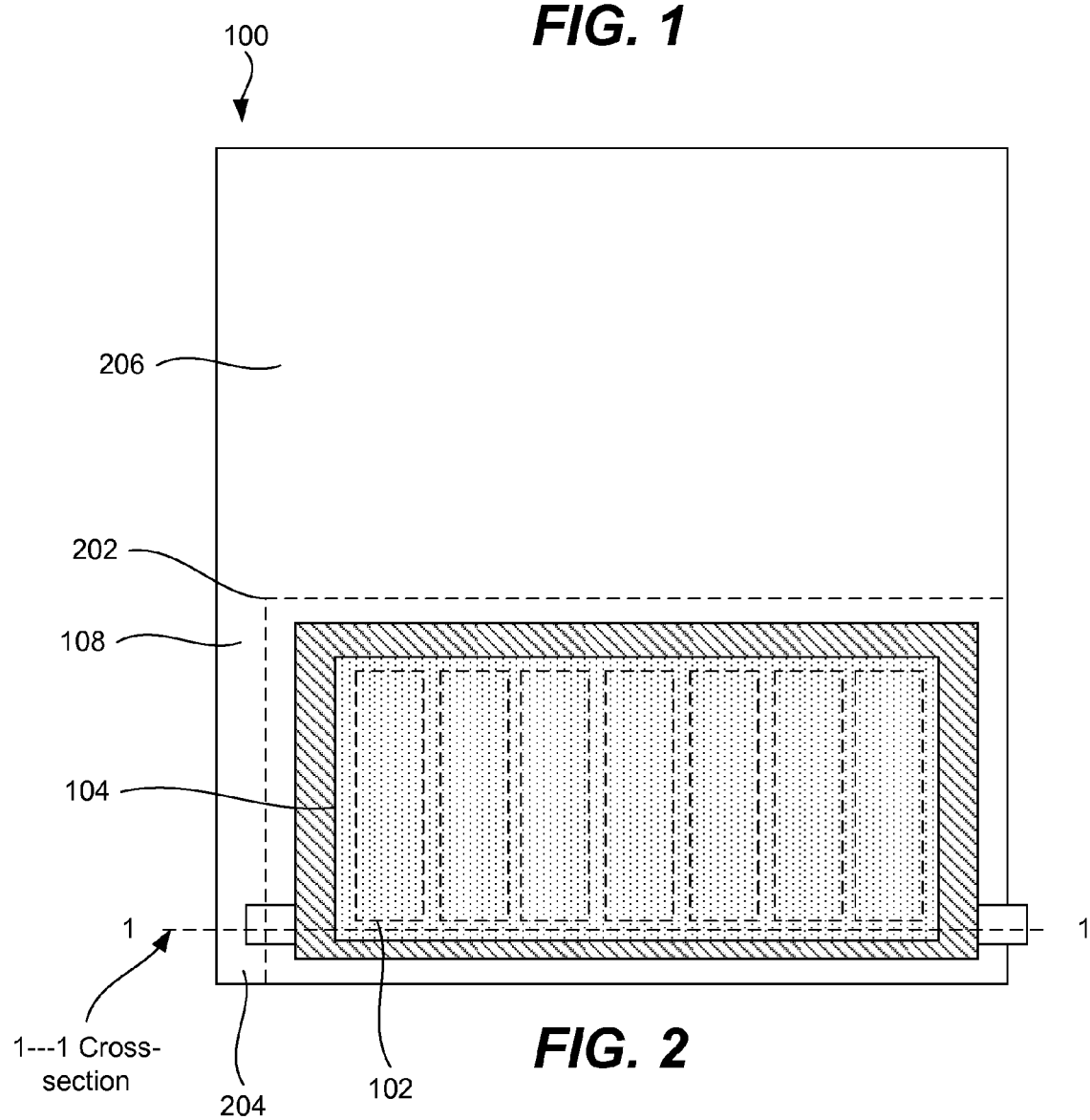
FIG. 2 is a schematic top view of a BIPV module, in accordance with certain embodiments.

BIPV module 100 has one or more electrical connectors 112 for electrically connecting BIPV module 100 to other BIPV modules and array components, such as an inverter and/or a battery pack. In certain embodiments, BIPV module 100 has two electrical connectors 112 positioned on opposite sides (e.g., the short or minor sides of a rectangular module) of BIPV module 100, as shown in FIGS. 1 and 2, for example. However, connectors may also be positioned on other sides as well (e.g., the long or major sides of a rectangular module). Connector position may depend on the overall arrangement of the module and/or installation and repair requirements. Each one of two electrical connectors 112 has at least one conductive element electrically connected to photovoltaic cells 102. In certain embodiments, electrical connectors 112 have additional conductive elements, which may or may not be directly connected to photovoltaic cells 102. For example, each of two electrical connectors 112 may have two conductive elements, one of which is electrically connected to photovoltaic cells 102, while the other is electrically connected to a bus bar (not shown) passing through BIPV module 100. This and other examples are described in more detail in the context of FIGS. 6 and 7. In general, regardless of the number of connectors 112 attached to BIPV module 100, at least two conductive elements of these connectors 112 are electrically connected to photovoltaic cells 102.

FIG. 2 is a schematic top view of BIPV module 100, in accordance with certain embodiments. Support sheet 108 is shown to have a side skirt 204 and a flap portion 206 extending beyond a photovoltaic portion 202 of BIPV module 100. Side skirt 204 is sometimes referred to as a side flap, while flap portion 206 is sometimes referred to as a top lap or a moisture flap. In certain embodiments, BIPV module 100 does not include side skirt 204. Photovoltaic portion 202 is defined as an area of BIPV module 100 that does not extend under other BIPV modules or similar building materials (e.g., roofing shingles) after installation. Photovoltaic portion 202 includes photovoltaic cells 102. Generally, it is desirable to maximize the ratio of the exposed area of photovoltaic cells 102 to photovoltaic portion 202 in order to maximize the "working area" of BIPV module 100. It should be noted that, after installation, flaps of other BIPV modules typically extend under photovoltaic portion 202. In a similar manner, after installation, side skirt 204 of BIPV module 100 may extend underneath another BIPV module positioned on the left (in the same row) of BIPV module 100, thereby creating an overlap for moisture sealing. Flap portion 206 may extend underneath one or more BIPV modules positioned above BIPV module 100. Arrangements of BIPV modules in an array will now be described in more detail with reference to FIGS. 3 and 4.

Figure 3:
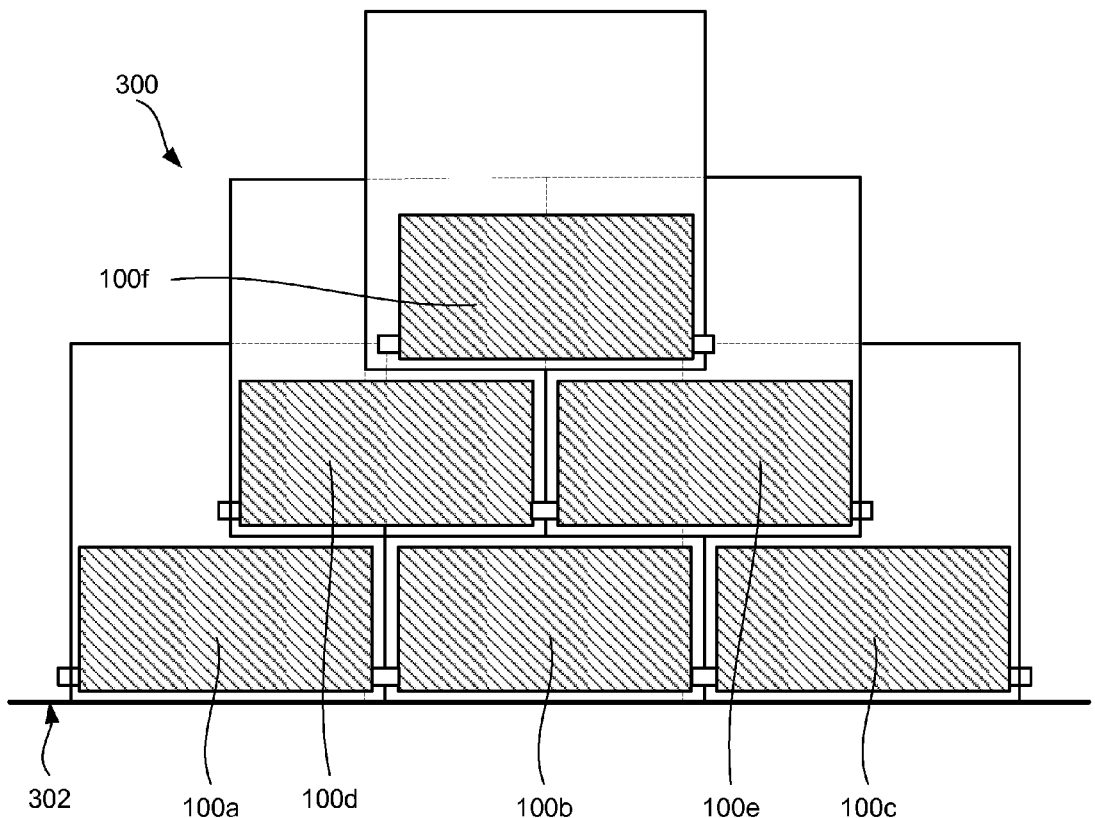
FIG. 3 illustrates a subset of a photovoltaic array that includes six BIPV modules, in accordance with certain embodiments.

FIG. 3 illustrates a photovoltaic array 300 or, more specifically, a portion of a photovoltaic array, which includes six BIPV modules 100a-100f arranged in three different rows extending along horizontal rooflines, in accordance with certain embodiments. Installation of BIPV modules 100a-100f generally starts from a bottom roofline 302 so that the top flaps of BIPV modules 100a-100f can be overlapped with another row of BIPV modules. If a side flap is used, then the position of the side flap (i.e., a left flap or a right flap) determines which bottom corner should be the starting corner for the installation of the array. For example, if a BIPV module has a top flap and a right-side flap, then installation may start from the bottom left corner of the roof or of the photovoltaic array. Another BIPV module installed later in the same row and on the right of the initial BIPV module will overlap the side flap of the initial BIPV module. Furthermore, one or more BIPV modules installed in a row above will overlap the top flap of the initial BIPV module. This overlap of a BIPV module with a flap of another BIPV module creates a moisture barrier.

Figure 4:
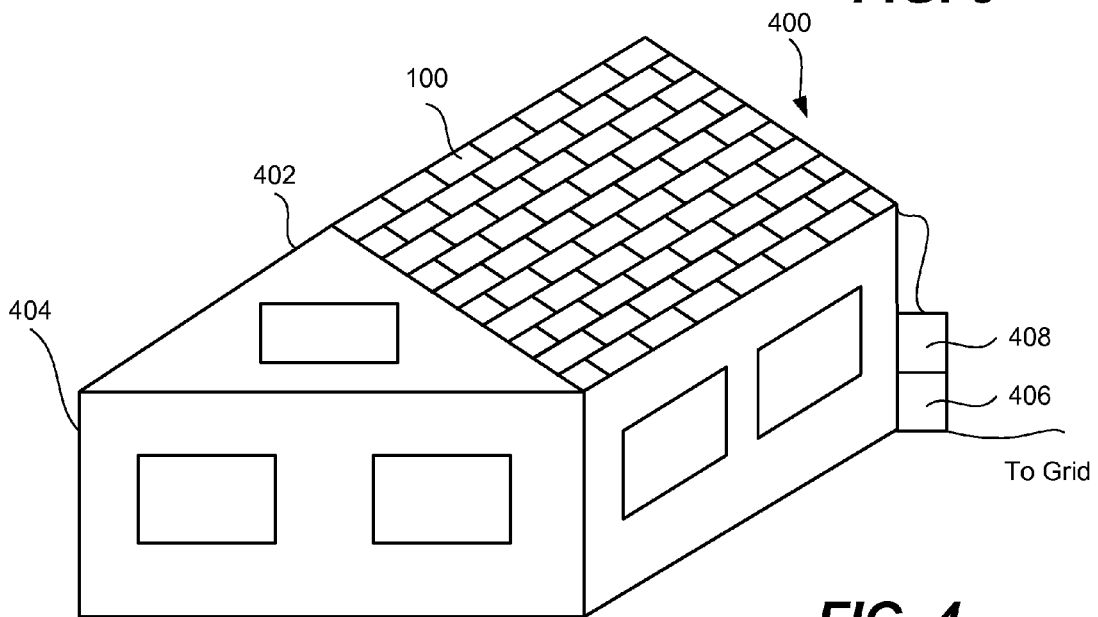
FIG. 4 is a schematic illustration of a photovoltaic array installed on a rooftop of a building structure, in accordance with certain embodiments.

FIG. 4 is a schematic illustration of a photovoltaic array 400 installed on a rooftop 402 of a building structure 404 for protecting building structure 404 from the environment as well as producing electricity, in accordance with certain embodiments. Multiple BIPV modules 100 are shown to fully cover one side of rooftop 402 (e.g., a south side or the side that receives the most sun). In other embodiments, multiple sides of rooftop 402 are used for a photovoltaic array. Furthermore, some portions of rooftop 402 may be covered with conventional roofing materials (e.g., asphalt shingles). As such, BIPV modules 100 may also be used in combination with other roofing materials (e.g., asphalt shingles) and cover only a portion of rooftop. Generally, BIPV modules 100 may be used on steep sloped to low slope rooftops. For example, the rooftops may have a slope of at least about 2.5-to-12 or, in many embodiments, at least about 3-to-12.

Multiple BIPV modules 100 may be interconnected in series and/or in parallel with each other. For example, photovoltaic array 400 may have sets of BIPV modules 100 interconnected in series with each other (i.e., electrical connections among multiple photovoltaic modules within one set), while these sets are interconnected in parallel with each other (i.e., electrical connections among multiple sets in one array). Photovoltaic array 400 may be used to supply electricity to building structure 404 and/or to an electrical grid. In certain embodiments, photovoltaic array 400 includes an inverter 406 and/or a battery pack 408. Inverter 406 is used for converting a direct current (DC) generated by BIPV modules 100 into an alternating current (AC). Inverter 406 may be also configured to adjust a voltage provided by BIPV modules 100 or sets of BIPV modules 100 to a level that can be utilized by building structure 404 or by a power grid. In certain embodiments, inverter 406 is rated up to 600 volts DC input or even up to 1000 volts DC, and/or up to 10 kW power. Examples of inverters include a photovoltaic static inverter (e.g., BWT10240-Gridtec 10, available from Trace Technologies in Livermore, Calif.) and a string inverter (e.g. Sunny Boy®.2500 available from SMA America in Grass Valley, Calif.). In certain embodiments, BIPV modules 100 may include integrated inverters (i.e., "on module" inverters). These inverters may be used in addition to or instead of external inverters. Battery pack 408 is used to balance electric power output and consumption.

Figure 5:
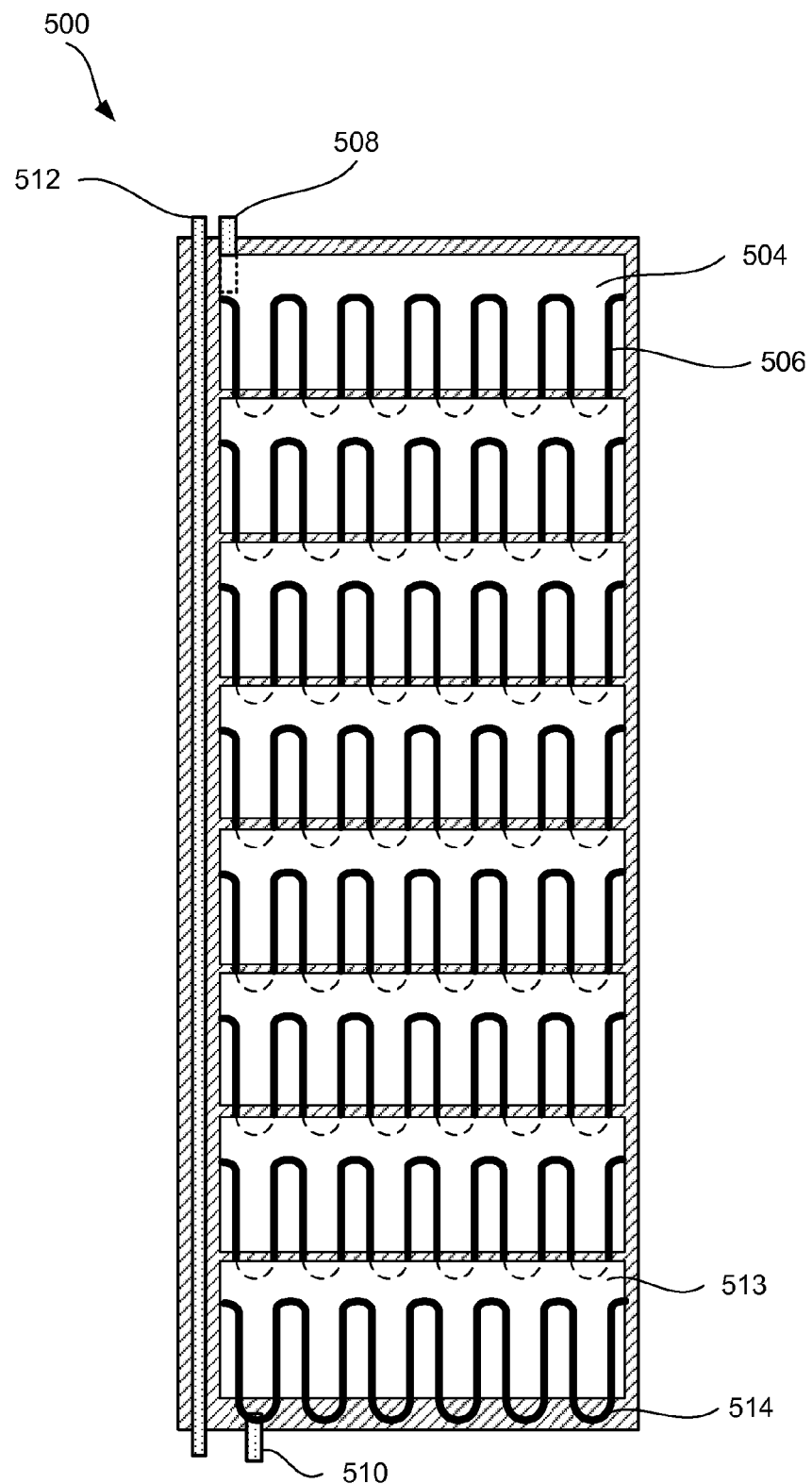
FIG. 5 is a schematic representation of a photovoltaic module having electrically interconnected photovoltaic cells, in accordance with certain embodiments.

FIG. 5 is a schematic representation of photovoltaic module insert 500 illustrating photovoltaic cells 504 electrically interconnected in series using interconnecting wires 506, in accordance with certain embodiments. Often individual cells 504 do not provide an adequate output voltage. For example, a typical voltage output of an individual CIGS cell is only between 0.4V and 0.7V. To increase voltage output, photovoltaic cells 504 may be electrically interconnected in series (for example, as shown in FIG. 5) and/or include "on module" inverters (not shown). Interconnecting wires 506 may also be used to provide uniform current distribution and collection from one or both contact layers.

As shown in FIG. 5, each pair of photovoltaic cells 504 has one interconnecting wire positioned in between the two cells and extending over a front side of one cell and over a back side of the adjacent cell. For example, a top interconnecting wire 506 in FIG. 5 extends over the front light-incident side of cell 504 and under the back side of the adjacent cell. In the figure, the interconnecting wires 506 also collect current from the TCO layer and provide uniform current distribution, and may be referred to herein as current collectors. In other embodiments, separate components are used for current collection and cell-to-cell interconnection. End cell 513 has a current collector 514 that is positioned over the light incident side of cell 513 but does not connect to another cell. Current collector 514 connects cell 513 to a bus bar 510. Another bus bar 508 may be connected directly to the substrate of the cell 504 (i.e., the back side of cell 504). In another embodiment, a bus bar may be welded to a wire or other component underlying the substrate. In the configuration shown in FIG. 5, a voltage between bus bars 508 and 510 equals a sum of all cell voltages in insert 500. Another bus bar 512 passes through insert 500 without making direct electrical connections to any photovoltaic cells 504. This bus bar 512 may be used for electrically interconnecting this insert in series without other inserts, as further described below with reference to FIG. 6. Similar current collectors/interconnecting wires may be used to interconnect individual cells or set of cells in parallel (not shown).

Figure 6:
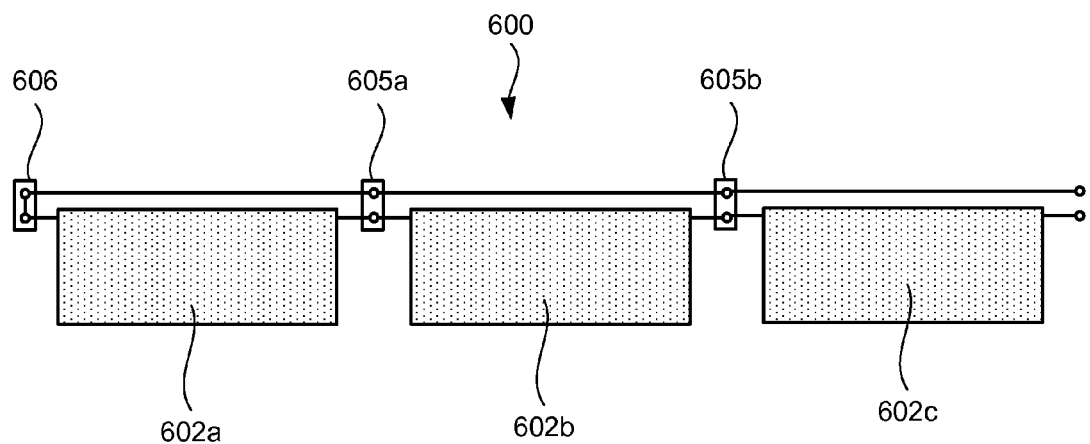
FIG. 6 is a schematic electrical diagram of a photovoltaic array having three BIPV modules interconnected in series, in accordance with certain embodiments.

BIPV modules themselves may be interconnected in series to increase a voltage of a subset of modules or even an entire array. FIG. 6 illustrates a schematic electrical diagram of a photovoltaic array 600 having three BIPV modules 602a-602c interconnected in series using module connectors 605a, 605b, and 606, in accordance with certain embodiments. A voltage output of this three-module array 600 is a sum of the voltage outputs of the three modules 602a-602c. Each module connector 605a and 605b shown in FIG. 6 may be a combination of two module connectors of BIPV modules 602a-602c. These embodiments are further described with reference to FIGS. 8A-8C. In other words, there may be no separate components electrically interconnecting two adjacent BIPV modules, with the connection instead established by engaging two connectors installed on the two respective modules. In other embodiments, separate connector components (i.e., not integrated into or installed on BIPV modules) may be used for connecting module connectors of two adjacent modules.

Module connector 606 may be a special separate connector component that is connected to one module only. It may be used to electrically interconnect two or more conductive elements of the same module connector (e.g., to close an electrical loop in a series of connections).

Figure 7:
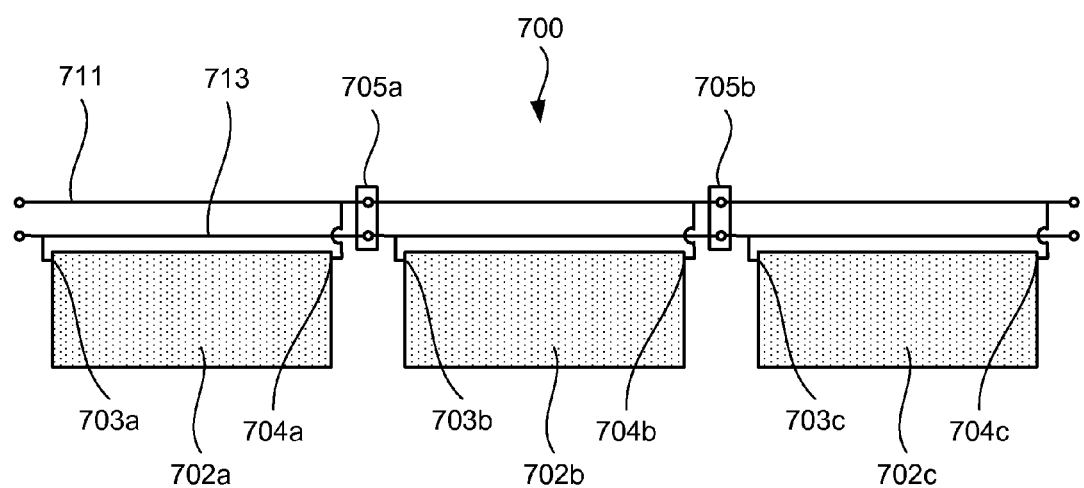
FIG. 7 is a schematic electrical diagram of a photovoltaic array having three BIPV modules interconnected in parallel, in accordance with other embodiments.

Sometimes BIPV modules may need to be electrically interconnected in parallel. FIG. 7 illustrates a schematic electrical diagram of a photovoltaic array 700 having three BIPV modules 702*a*-702*c* interconnected in parallel using module connectors 705*a* and 705*b*, in accordance with certain embodiments. Each module may have two bus bars extending through the module (i.e., a "top" bus bar 711 and a "bottom" bus bar 713, as shown in FIG. 7). Top bus bars 711 of each module are connected to right electrical leads 704*a*, 704*b*, and 704*c* of the modules, while bottom bus bars 713 are connected to left electrical leads 703*a*, 703*b*, and 703*c*. A voltage between the top bus bars 711 and bottom bus bars 713 is therefore the same along the entire row of BIPV modules 702*a*-702*c*.

Figure 8A:
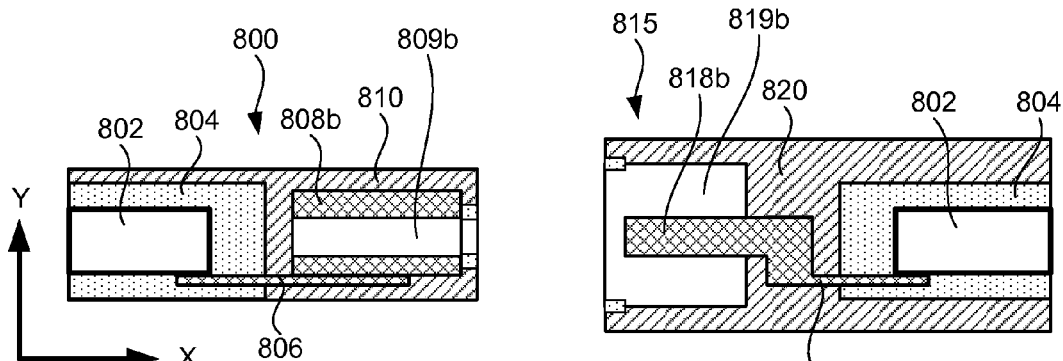
FIGS. 8A-8C are schematic cross-sectional views of two connectors configured for interconnection with each other, in accordance with certain embodiments.

FIG. 8A is a schematic cross-sectional side view of two connectors 800 and 815 configured for interconnection with each other, in accordance with certain embodiments. For simplicity, the two connectors are referred to as a female connector 800 and a male connector 815. Each of the two connectors 800 and 815 is shown attached to its own photovoltaic insert, which includes photovoltaic cells 802 and one or more sheets 804. Connectors 800 and 815 include conductive elements 808*b* and 818*b*, respectively, which are shown to be electrically connected to photovoltaic cells 802 using bus bars 806 and 816, respectively.

In certain embodiments, a conductive element of one connector (e.g., conductive element 808*b* of female connector 800) is shaped like a socket/cavity and configured for receiving and tight fitting a corresponding conductive element of another connector (e.g., conductive element 818*b* of male connector 815). Specifically, conductive element 808*b* is shown forming a cavity 809*b*. This tight fitting and contact in turn establishes an electrical connection between the two conductive elements 808*b* and 818*b*. Accordingly, conductive element 818*b* of male connector 815 may be shaped like a pin (e.g., a round pin or a flat rectangular pin). A socket and/or a pin may have protrusions (not shown) extending towards each other (e.g., spring loaded tabs) to further minimize the electrical contact resistance by increasing the overall contact area. In addition, the contacts may be fluted to increase the likelihood of good electrical contact at multiple points (e.g., the flutes guarantee at least as many hot spot asperities of current flow as there are flutes).

Figure 8B:
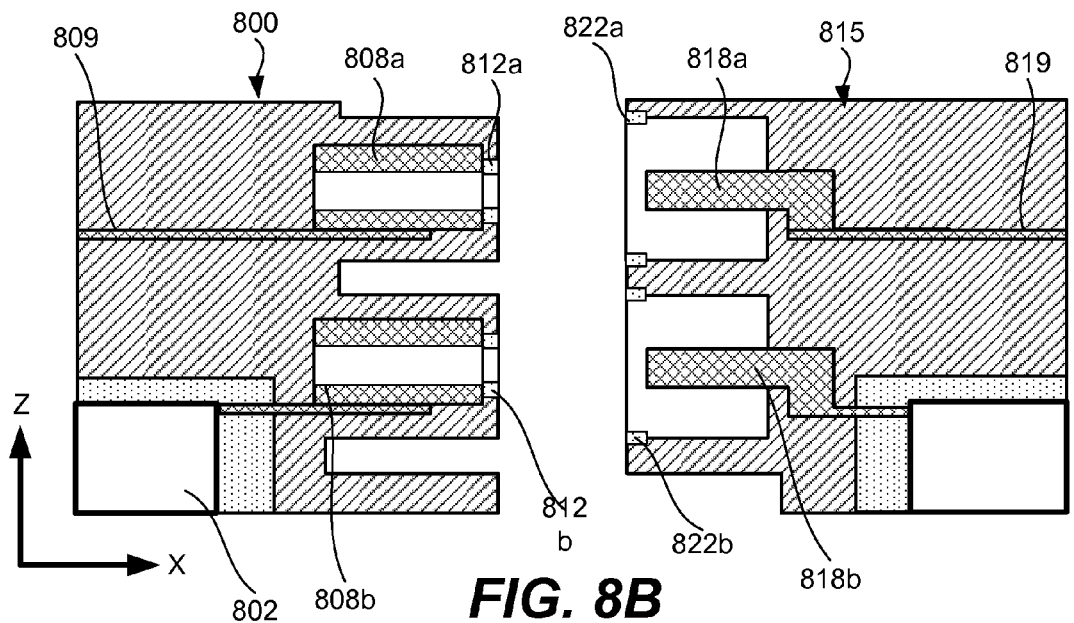
Figure 8C:
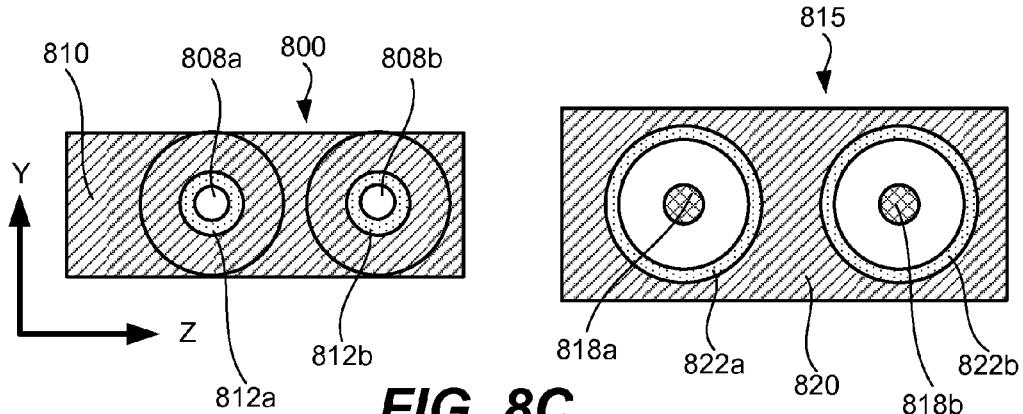

In certain embodiments, connectors do not have a cavity-pin design as shown in FIGS. 8A-8C. Instead, an electrical connection may be established when two substantially flat surfaces contact each other. Conductive elements may be substantially flat or have some topography designed to increase a contact surface over the same projection boundary and/or to increase contact force at least in some areas. Examples of such surface topography features include multiple pin-type or rib-type elevations or recesses.

In certain embodiments, one or more connectors attached to a BIPV module have a "touch free" design, which means that an installer cannot accidently touch conductive elements or any other electrical elements of these connectors during handling of the BIPV module. For example, conductive elements may be positioned inside relatively narrow cavities. The openings of these cavities are too small for a finger to accidently come in to contact with the conductive elements inside the cavities. One such example is shown in FIG. 8A where male connector 815 has a cavity 819*b* formed by connector body 820 around its conductive pin 818*b*. While cavity 819*b* may be sufficiently small to ensure a "touch free" designed as explained above, it is still large enough to accommodate a portion of connector body 810 of female connector 800. In certain embodiments, connector bodies 810 and 820 have interlocking features (not shown) that are configured to keep the two connectors 800 and 815 connected and prevent connector body 810 from sliding outs of cavity 819*b*. Examples of interlocking features include latches, threads, and various recess-protrusion combinations.

FIG. 8B is schematic plan view of female connector 800 and male connector 815, in accordance with certain embodiments. Each of the connectors 800 and 815 is shown with two conductive elements, i.e., conductive elements 808*a* and 808*b* formed as sockets in connector 800 and conductive elements 818*a* and 818*b* formed as pins in connector 815. One conductive element of each connector is shown to be electrically connected to photovoltaic cells 802. Another conductive element of each of the two connectors 800 and 815 may be connected to bus bars (e.g., bus bars 809 and 819) that do not have an immediate electrical connection to photovoltaic cells 802 of their respective BIPV module (the extended electrical connection may exist by virtue of a complete electrical circuit).

As shown, conductive elements 808*a* and 808*b* may have their own designated inner seals 812*a* and 812*b* Inner seals 812*a* and 812*b* are designed to provide more immediate protection to conductive elements 808*a* and 818*a* after connecting the two connectors 800, 815. As such, inner seals 812*a* and 812*b* are positioned near inner cavities of conductive elements 808*a* and 808*b*. The profile and dimensions of pins 818*a* and 818*b* closely correspond to that of inner seals 812*a* and 812*b*. In the same or other embodiments, connectors 800, 815 have external seals 822*a* and 822*b*. External seals 822*a* and 822*b* may be used in addition to or instead of inner seals 812*a* and 812*b*. Various examples of seal materials and fabrication methods are described below in the context of FIG. 9. FIG. 8C is schematic front view of female connector 800 and male connector 815, in accordance with certain embodiments. Connector pins 818*a* and 818*b* are shown to have round profiles. However, other profiles (e.g., square, rectangular) may also be used for pins 818*a* and 818*b* and conductive elements 808*a* and 808*b*.

FIGS. 9A-13 provide further details of BIPV modules including integrated jumpers. Specific features of integrated jumpers are described below first with reference to individual BIPV modules, then with reference to various photovoltaic strings having multiple interconnected BIPV modules, and, finally, with reference to certain installation methods.

Figure 9A:
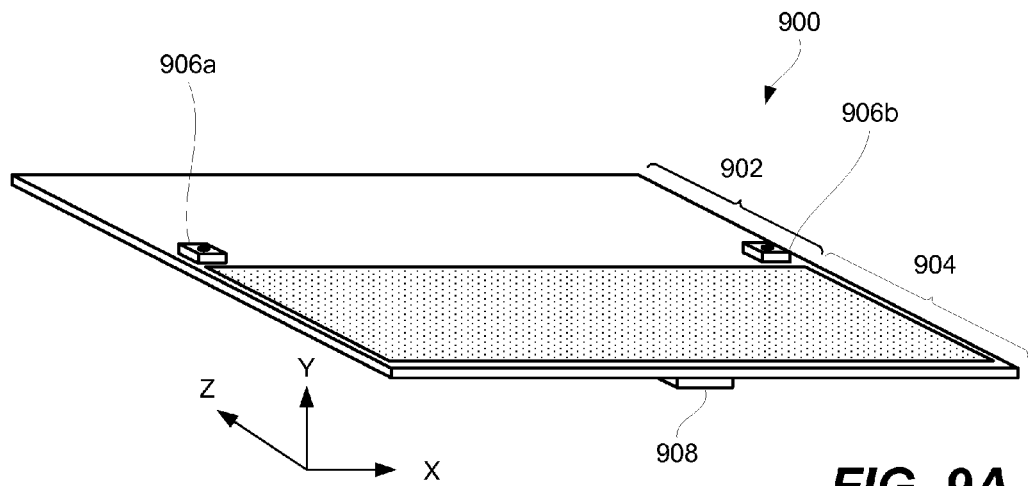
FIG. 9A is a schematic perspective view of a BIPV module including two connectors positioned on the front side of the module and an integrated jumper on its back side, in accordance with certain embodiments.

FIG. 9A is a schematic perspective view of a BIPV module 900 including two connectors 906*a* and 906*b* positioned on the front side of the module and an integrated jumper 908 positioned on the back side, in accordance with certain embodiments. The relative position of connectors 906*a* and 906*b* and integrated jumper 908 is such that when module 900 is positioned over two other similar modules provided in an adjacent row, integrated jumper 908 will align and establish electrical connections with connectors of the two modules.

Module 900 includes a flap portion 902 for extending under other adjacent modules and a photovoltaic portion 904 containing one or more photovoltaic cells. Flap portion 902 is sometimes referred to as a top flap, moisture flap or a skirt.

When module 900 is installed on a building structure, flap portion 902 is covered by one or more other components, such as other BIPV modules, asphalt shingles, and so forth. In specific installed embodiments, flap portion 902 extends under photovoltaic portions of two other similar BIPV modules and seals any seams that may exist in between the two photovoltaic portions of the two other BIPV modules. Flap portion 902 may be slightly longer (in the Z direction) than corresponding photovoltaic portion 904 to ensure proper sealing.

As shown in FIG. 9A, flap portion 902 may provide support to two connectors 906a and 906b. Specifically, connectors 906a and 906b are positioned on the front side of flap portion 902 and adjacent to an interface between flap portion 902 and photovoltaic portion 904. This interface may be also referred to as a first edge of photovoltaic portion 904. Connectors 906a and 906b may be positioned slightly away (i.e., at a predetermined distance) from this first edge to ensure that connectors 906a and 906b are covered during installation of the array by other components, such as two other BIPV modules. In some embodiments, the positions of connectors 906a and 906b are specifically determined to coincide with the integrated jumpers of two modules in an adjacent row as, for example, shown in FIGS. 10-12. Therefore, if connectors 906a and 906b shifted in the Z direction, the integrated jumper also is shifted in the Z direction by the same distance. In a similar manner, the position of connectors 906a and 906b along the first edge in the X direction can determine the width of integrated jumper 908. In certain embodiments shown in FIGS. 9A-9C, connectors 906a and 906b are positioned adjacent to the side edges of flap portion 902. For example, the connectors 906a and 906b can be in or adjacent to the corners formed by the side edges and the first edge. In some embodiments, the closer connectors 906a and 906b are to opposing side edges, the smaller the minimum width of integrated jumper 908. As connectors 906a and 906b move away from the side edges and closer to a mid-point of the first edge, the width of integrated jumper 908 is increased to allow the integrated jumper 908 to connect to connectors of two adjacent modules. In one case shown in FIG. 9B, a BIPV module 910 has two connectors integrated into the same body 916 in the middle of the first edge, while an integrated jumper is split into two separate bodies 918a and 918b positioned near the ends of a second edge of the photovoltaic portion 904.

Returning to FIG. 9A, photovoltaic portion 904 includes one or more photovoltaic cells on the front side, such as copper indium gallium selenide (CIGS) and other types of cells. The cells may be interconnected in series or according to some other interconnection schemes, such as a combination of in-series and in-parallel connections. The cells can be interconnected in such a way that only two electrical leads extend to connectors 906a and 906b. These leads have different polarities, which depend on the particular connections of these leads to the photovoltaic cells. For example, the polarity of a lead can be determined by whether the lead connects to the front side or back side of a photovoltaic cell. In some embodiments, the polarity of the respective connector contact points of connectors 906a and 906b may be changed to provide two different types of BIPV modules, which will now be described in more detail with reference to FIGS. 9C and 9D.

Figure 9B:
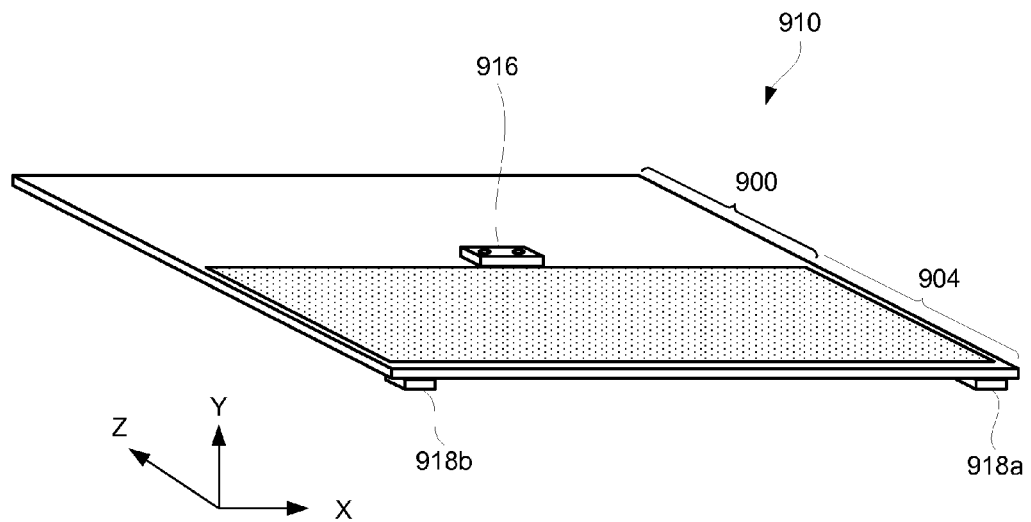
FIG. 9B is schematic perspective view of another BIPV module having two connectors integrated into the same body and an integrated jumper split into two separate bodies, in accordance with certain embodiments.
Figure 9C:
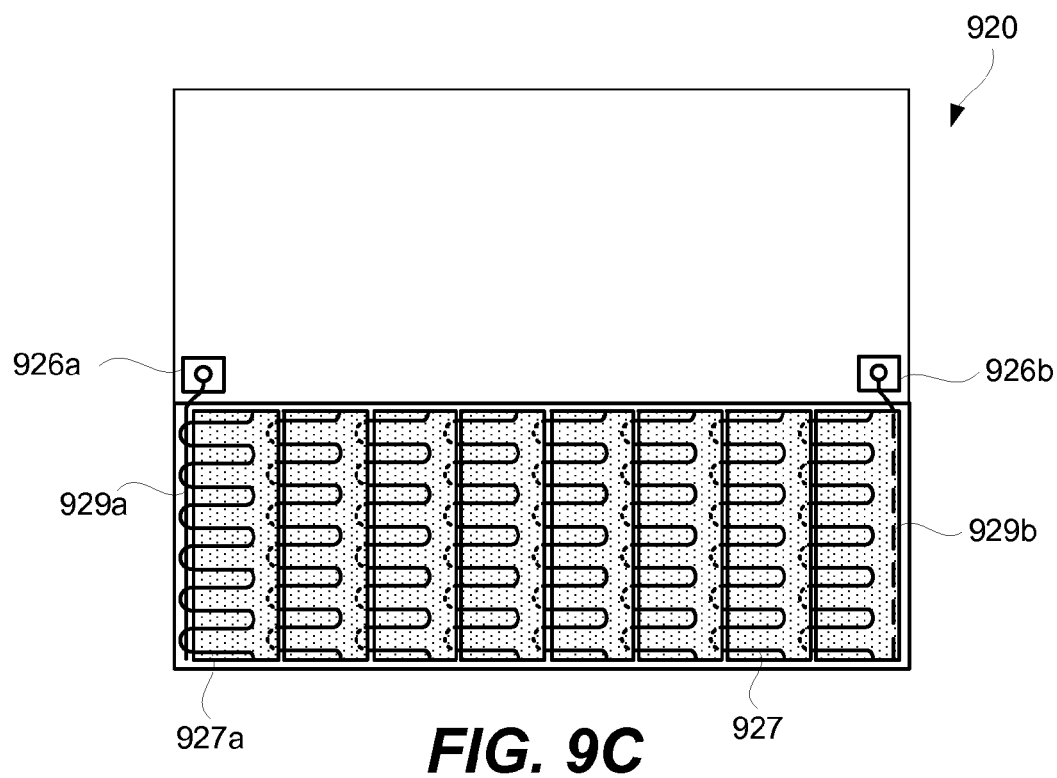
FIG. 9C is a schematic top view of a BIPV module having two connectors arranged and connected according to one polarity scheme.

FIG. 9C is a schematic top view of a BIPV module 920 having two connectors 926a and 926b arranged and connected according to one polarity scheme, in accordance with certain embodiments. This view shows multiple individual photovoltaic cells interconnected in series using interconnecting structures extending over, under, and in between the cells. A specific example of an interconnecting structure as shown in FIG. 9B is a serpentine-shaped wire 927 extending over a front side of one cell and under a back side of an adjacent cell. Other types of interconnecting structures may also be used. Any number of cells and interconnecting structures may be used in each module depending on the operating voltages of the cells, interconnecting schemes, and voltage output requirements.

One side of each cell corresponds to one electrical terminal of the cell, while another side of the cell represents another electrical terminal. In series connections among cells are provided by interconnecting two different polarity terminals of adjacent cells. In a specific example, transparent conductive oxide (TCO) layers that form the front sides of certain photovoltaic cells represent positive terminals, while stainless steel substrate strips that form the back sides of these cells represent negative terminals. One having ordinary skill in the art would understand that polarity references are relative and may be changed depending on types of photovoltaic cells, orientation of cells within the module, interconnection schemes, and other factors. Therefore, for purposes of this document, different polarities are referred to as a first polarity and a second polarity. The first polarity may be a negative polarity in some examples and a positive polarity in other examples, and vice versa for the second polarity. In the following description of photovoltaic modules 920 and 930 illustrated in FIGS. 9C and 9D, respectively, front sides of the cells are considered to have the first polarity, while back sides of the cells are considered to have the second polarity.

FIG. 9C illustrates left connector 926a connected to the leftmost interconnecting structure 927a, which extends over a front side of the leftmost cell. Therefore, left connector 926a will have the first polarity. At the same time, right connector 926b is connected to the back side of the rightmost cell. This connection may be formed by a bus bar connected directly to the backside or through a separate interconnecting structure (not shown). Therefore, right connector 926b will have the second polarity. Connectors 926a and 926b are connected to the leftmost and rightmost cells, by bars 929a and 929b, respectively. Bars 929a and 929b can be part of the respective connector or a separate bus bar to which the respective connector is connected.

Figure 9D:
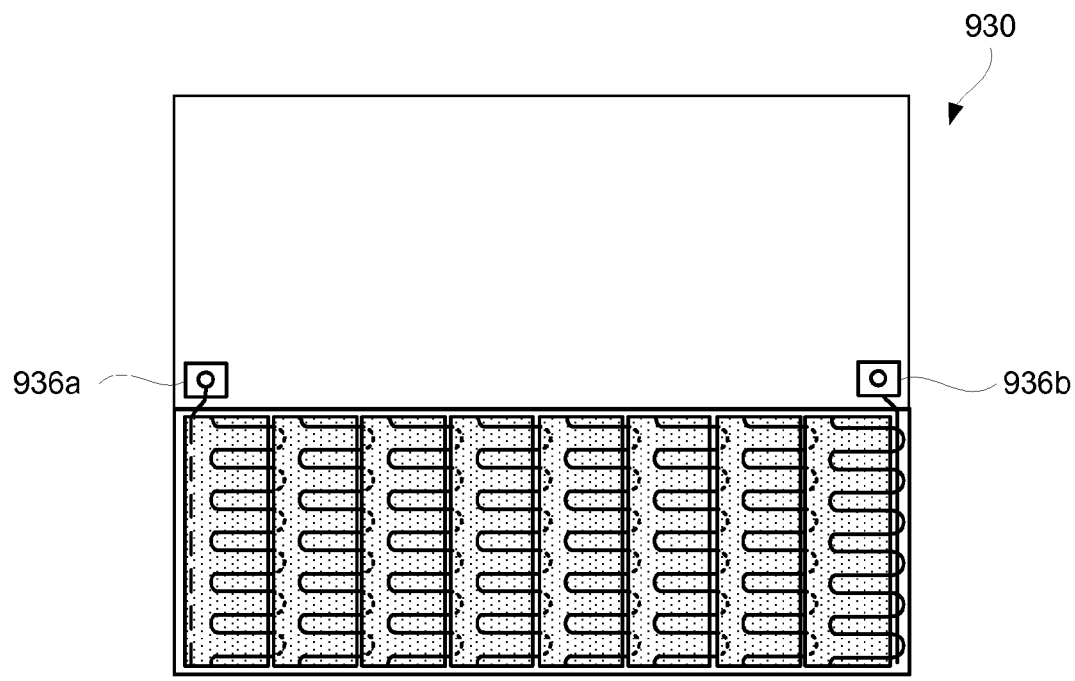
FIG. 9D is a schematic top view of another BIPV module having two connectors arranged and connected according to a different polarity scheme.

FIG. 9D is a schematic illustration of a different module 930, which has two connectors, 936a and 936b, arranged and connected according to a different polarity scheme. The polarity of connectors 936a and 936b is different than or, more specifically, the inverse of the polarity of connectors 926a and 926b of module 920 described above. Specifically, left connector 936a is connected to the back side of the leftmost cell. This connection may be formed by a bus bar connected directly to the backside or through a separate interconnecting structure (not shown). Therefore, left connector 936a will have the second polarity. At the same time, right connector 923b is connected to the rightmost interconnecting structure that extends over a front side of the rightmost cell. Therefore, right connector 936b will have the first polarity.

A series connection between modules requires connections between connector contact points having different polarity. Therefore, when modules 920 and 930 are interconnected during installation, right connector 926b should be connected with right connector 936b or left connector 926a should be connected with left connector 936a. When one row is formed from modules similar to module 920, while another adjacent row is formed from modules similar to module 930, the ends of these rows may be easily connected, as further explained below with reference to FIGS. 10 and 11. For simplicity, individual photovoltaic cells and internal module connections are not shown in these figures. Instead, different polarities are distinguished with different types of lines extending towards the respective connections (i.e., one polarity is schematically shown with a dashed line, while another polarity is shown with a solid line).

Figure 9E:
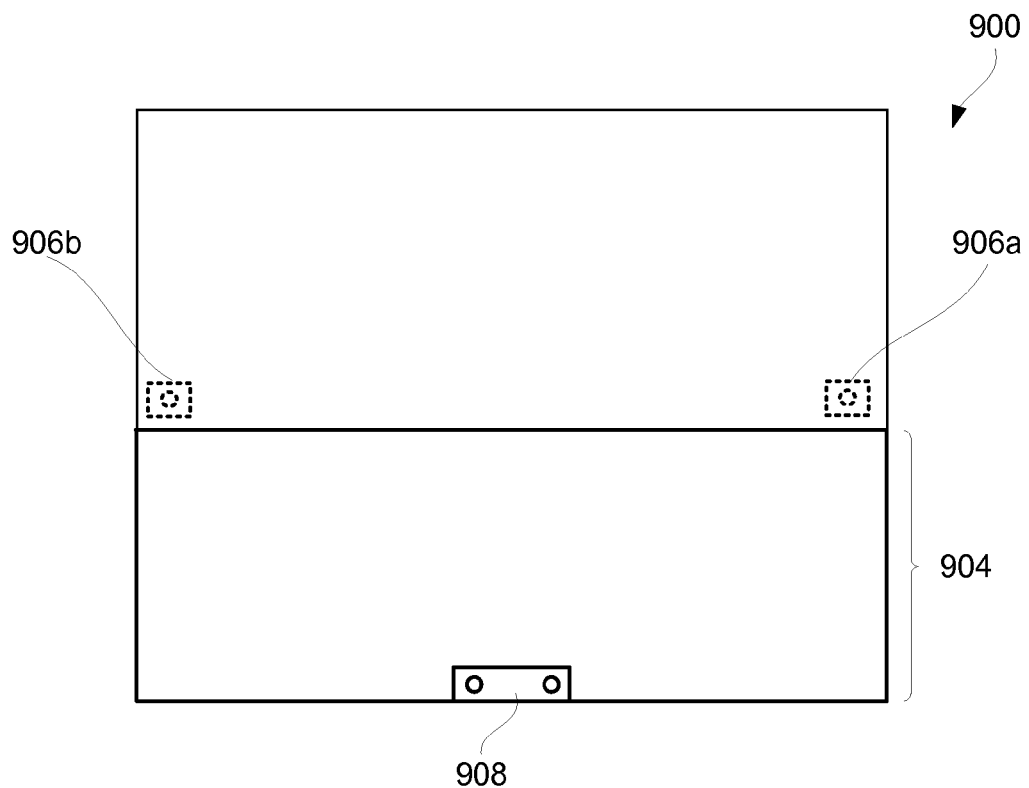
FIG. 9E is a schematic bottom view of the BIPV module shown in FIG. 9A, in accordance with certain embodiments.

Electrical connections between modules are provided using connectors and integrated jumpers or, more specifically, using connector contact points and jumper contact points. In FIGS. 9A-9D, these contact points are shown with circles provided on respective connectors or integrated jumpers. Each of the connectors has one connector contact point that is electrically connected to one or more photovoltaic cells of its corresponding module. In certain embodiments, connectors have additional contact points as, for example, shown in FIG. 12A. These additional connector contact points may be electrically disconnected from the photovoltaic cells but connected to other contact points on another connector or jumper. An integrated jumper generally includes at least two interconnected contact points as shown in FIG. 9E, which is a schematic bottom view of BIPV module 900 shown in FIG. 9A, which further illustrates integrated jumper 908 positioned on the back side of the photovoltaic portion 904. Each of the two jumper contact points of integrated jumper 908 is used for establishing electrical connections with the connector contact points of two modules positioned in an adjacent row. Since these two jumper contact points are interconnected, the two corresponding connector contact points also become interconnected, thereby providing an electrical connection between the photovoltaic cells in the two modules. In certain embodiments, an integrated jumper includes additional contact points for connecting to other contact points, edge jumpers, and field jumpers.

For purposes of this document, an integrated jumper is defined as a jumper that is integrated into a module during fabrication of the module and remains as part of the module during installation and operation. An integrated jumper may be made from a different material than, for example, the back side of the module or, more specifically, the back side of the photovoltaic portion of the module. The integrated jumper may have two or more jumper contact points for establishing various electrical connections. Integrated jumpers should be distinguished from edge jumpers or field jumpers, which are separate (from modules) components that are attached to the modules prior to or during installation of the modules. Edge jumpers are used for making electrical connections between one connector contact point and one jumper contact point, typically of the same module. Field jumpers are used for making electrical connection between two connector contact points of the same or different modules or two jumper contact points of the same module. Field jumpers are typically much smaller in size since they are used for connecting adjacent (or substantially adjacent) contact points (e.g., two contact points on the same jumper). Edge jumpers are much larger since they need to extend across a portion of the module (i.e., between one of its connectors and integrated jumper).

Figure 9F:
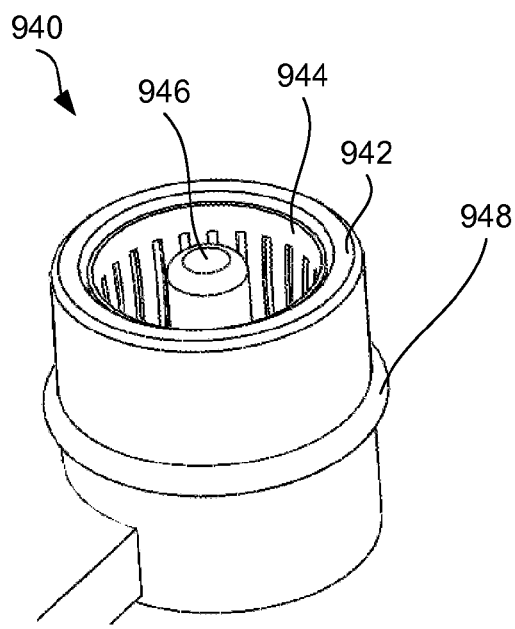
FIG. 9F is a schematic perspective view of one example of contact point.

In certain embodiments, connector contact points have complementary designs with respect to jumper contact points to allow direct interconnection between these two types of contact points without a need for any additional intermediate components. For example, one type of contact point may be formed as a male connector while another may be formed as a female connector. FIG. 9F is a schematic perspective view of one example of contact point 940. Contact point 940 includes a conductive element 944 positioned within an insulating shell 942. Conductive element 944 is configured to form an electrical connection with another conductive element of a different type of contact point. Conductive element 944 may be made from one or more of the following materials: copper, aluminum, nickel, silicon, beryllium, tin, tellurium, silver, phosphorous, cobalt, iron, zinc, chromium, zirconium, magnesium, titanium, and combinations thereof. Conductive element 944 is electrically connected to another contact point/conductive element (e.g., if contact point 940 is a part of the integrated jumper) or connected to one or more photovoltaic cells (e.g., if contact point 940 is a part of the connector).

In certain embodiments, conductive element 944 forms a cavity for insertion of another conductive element. The cavity may include an insulating pin 946 to prevent the accidental touching of conductive element 944 prior to installation. Contact point 940 may also include a seal 948 extending around insulating shell 942 and configured to seal any gap between two contact points after establishing electrical connection. The seal may be formed using an O-ring or other sealing components and materials such silicone sealant or butyl rubber inserts.

Figure 10A:
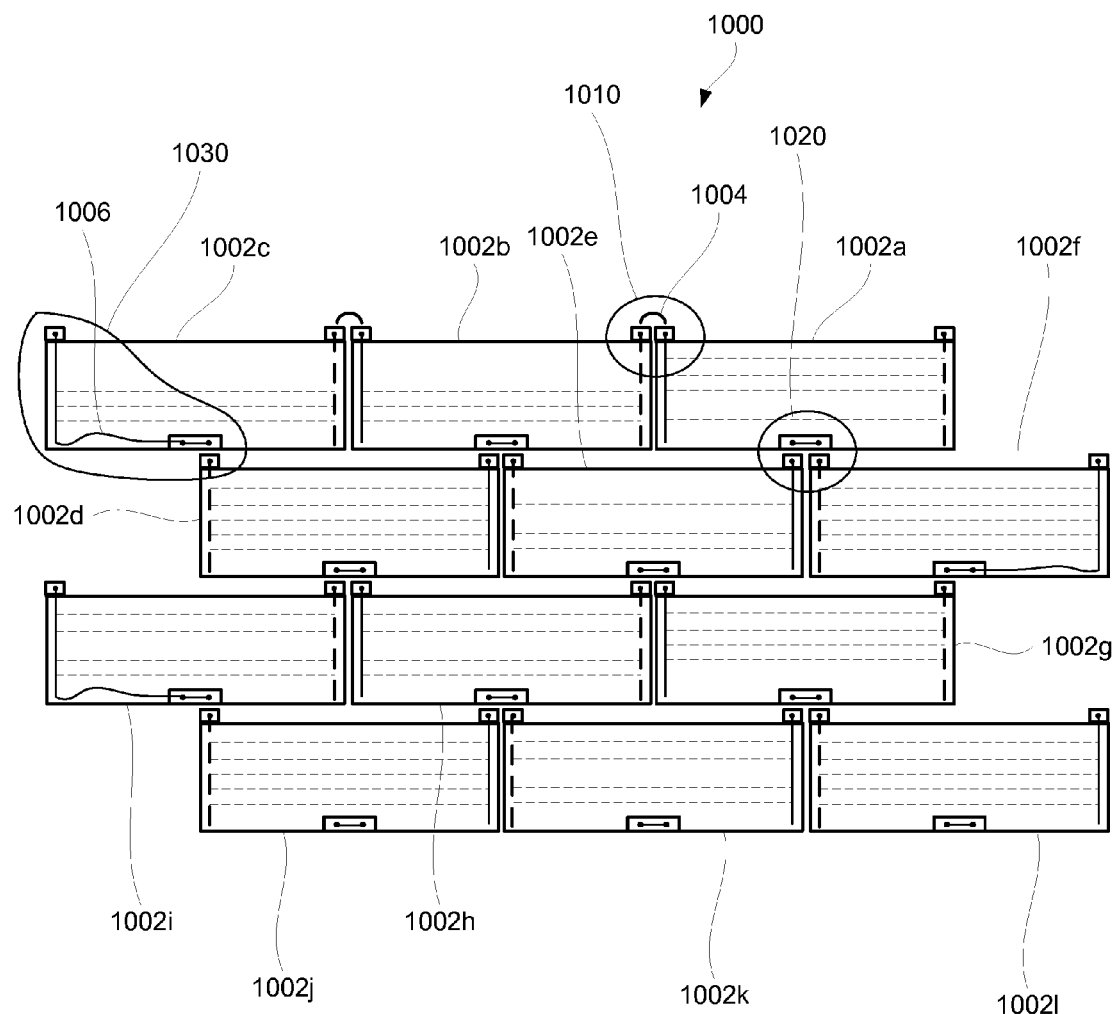
FIG. 10A is a schematic representation of a photovoltaic string including two types of BIPV modules, in accordance to certain embodiments.

Different kinds and types of BIPV modules will now be explained with reference to photovoltaic strings assembled from these modules. FIG. 10A is a schematic representation of a photovoltaic string 1000 including modules 1002a-1002l having two polarity orientations, in accordance to certain embodiments. Specifically, modules 1002a-1002c and modules 1002g-1002i have one type of polarity orientation represented by solid vertical lines extending to the left connectors and dashed vertical lines extending to the right connectors. Modules 1002d-1002f and modules 1002j-1002l have a different type of polarity orientation represented by solid vertical lines extending to the right connectors and dashed vertical lines extending to the left connectors. According to the naming convention introduced above, connector contact points connected to solid vertical lines have a first polarity, while connector contact points attached to the dashed vertical lines have a second polarity. Connectors having contact points of the first polarity are referred to as first connectors and connectors having contact points of the second polarity are referred to as second connectors in FIG. 10A. Similarly, a contact point of the first polarity is referred to as a first connector contact point and a contact point of the second polarity is referred to as a second connector contact point. This naming convention is also used for description of FIGS. 11 and 12 presented below.

Figure 10B:
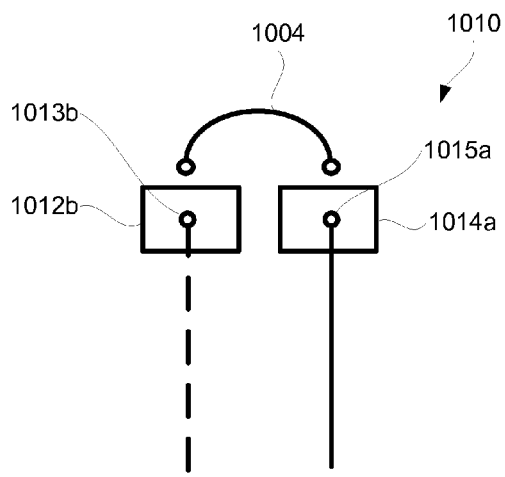
FIG. 10B is a schematic representation of a portion of the photovoltaic string shown in FIG. 10A illustrating use of a field jumper for interconnecting two contact points of two adjacent modules, in accordance to certain embodiments.

FIG. 10A shows three portions 1010, 1020, and 1030 of photovoltaic string 1000 having different connection schemes, which will now be described with reference to FIGS. 10B-10D. FIG. 10B is a schematic representation of portion 1010 illustrating use of field jumper 1004 for interconnecting contact points 1013b and 1015a, in accordance with certain embodiments. Specifically, contact point 1015a is a part of left connector 1014a of module 1002a, and it has the first polarity. Contact point 1013b is a part of right connector 1012b of module 1002b, and it has the second polarity. Modules 1002a and 1002b are positioned in the same row and adjacent to each other as shown in FIG. 10A. For clarity, field jumper 1004 is shown schematically separated from connectors 1012b and 1014a, i.e., it is shifted upwards. However, in the connected state, field jumper 1004 forms mechanical and electrical connections with 1013b and 1015a and interconnects these contact points. A similar connection scheme is used for interconnecting contact points of the left contact point of module 1002b and the right contact point of module 1002c.

Figure 10C:
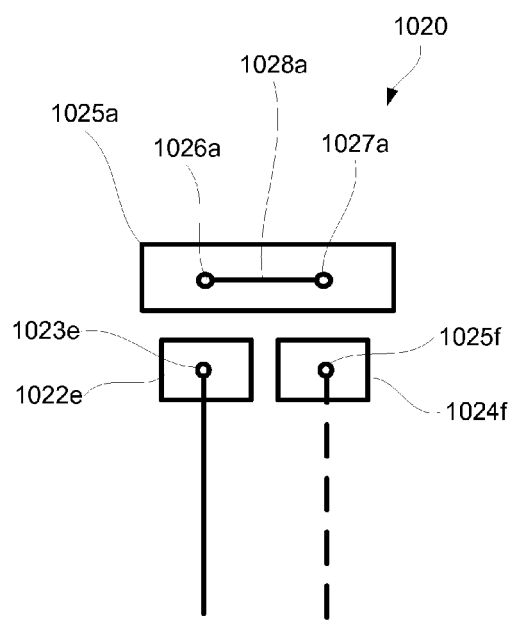
FIG. 10C is a schematic representation of another portion of the photovoltaic string shown in FIG. 10A illustrating use of an integrated jumper for interconnecting two contact points of two adjacent modules, in accordance to certain embodiments.

FIG. 10C is a schematic representation of another portion 1020 of photovoltaic string 1000 shown in FIG. 10A illustrating use of integrated jumper 1025a of module 1002a for interconnecting contact points 1023e and 1025f, in accordance to certain embodiments. Contact point 1025*f* is a part of left connector 1024*f* of module 1002*f*, and it has the second polarity. Contact point 1023*e* is a part of right connector 1022*e* of module 1002*e*, and it has the first polarity. Modules 1002*e* and 1002*f* are positioned in the same row and adjacent to each other as shown in FIG. 10A. Therefore, integrated jumper 1025*a* is used for connecting modules 1002*e* and 1002*f* in series. Specifically, contact point 1026*a* of integrated jumper 1025*a* makes an electrical connection with contact point 1023*e* of connector 1022*e*, while contact point 1027*a* makes an electrical connection with contact point 1025*f* of connector 1024*f*. Since contact points 1026*a* and 1027*a* are interconnected with jumper lead 1028*a*, integrated jumper 1025*a* interconnects contact points 1023*e* and 1025*f* or, more generally, modules 1002*e* and 1002*f*.

For clarity, integrated jumper 1025*a* is shown schematically separated from connectors 1022*e* and 1024*f*, i.e., it is shifted upwards. However, in the connected state, contact point 1026*a* of integrated jumper 1025*a* is electrically connected to contact point 1023*e* of connector 1022*e*, while contact point 1027*a* of integrated jumper 1025*a* is electrically connected to contact point 1025*f* of connector 1024*f*. Similar connection schemes are used for interconnecting contact points of the left connector of module 1002*e* and the right connector of module 1002*d*, between the left connector of module 1002*h* and the right connector of module 1002*i*, between the left connector of module 1002*g* and the right connector of module 1002*h*, between the left connector of module 1002*l* and the right connector of module 1002*k*, and finally between the left connector of module 1002*k* and the right connector of module 1002*j*.

Figure 10D:
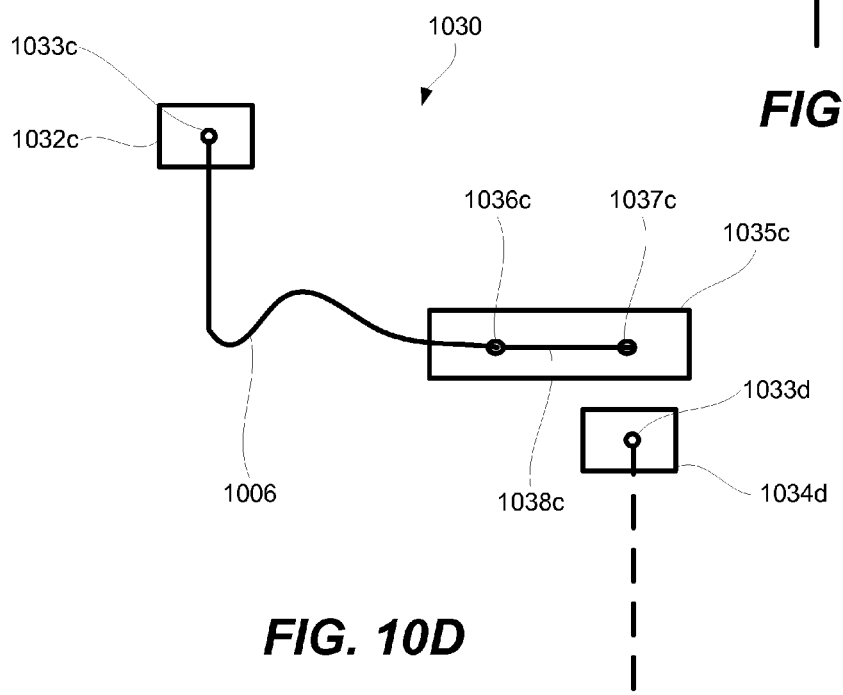
FIG. 10D is a schematic representation of yet another portion of the photovoltaic string shown in FIG. 10A illustrating use of an edge jumper and integrated jumper for interconnecting two contact points of two modules positioned in adjacent rows, in accordance to certain embodiments.

FIG. 10D is a schematic representation of yet another portion 1030 of photovoltaic string 1000 shown in FIG. 10A illustrating use of edge jumper 1006 as well as integrated jumper 1035*c* for interconnecting contact points 1033*c* and 1033*d*, in accordance to certain embodiments. Contact point 1033*d* is a part of left connector 1034*d* of module 1002*d*, and it has the second polarity. Contact point 1033*c* is a part of right connector 1032*c* of module 1002*c*, and it has the first polarity. Modules 1002*c* and 1002*d* are end modules positioned in adjacent rows as shown in FIG. 10A.

Contact point 1037*c* of integrated jumper 1035*c* makes an electrical connection with contact point 1033*d* of connector 1034*d*. Contact point 1037*c* is also connected by jumper lead 1038*c* to contact point 1036*c*, all within integrated jumper 1035*c*. At the same time, edge jumper 1006 connects contact point 1033*c* of connector 1032*c* to contact point 1036*c* of integrated jumper 1035*c*. Therefore, a combination of edge jumper 1006 and integrated jumper 1035*c* interconnect contact point 1033*c* of connector 1032*c* with contact point 1033*d* of connector 1034*d*.

For clarity, integrated jumper 1035*c* is shown schematically separated from connector 1034*d*, i.e., it is shifted upwards. However, in the connected state, contact point 1037*c* of integrated jumper 1035*c* is electrically connected to contact point 1033*d* of connector 1034*d*. Similar connection schemes are used for interconnecting contact points of the left connector of module 1002*i* and the left connector of module 1002*j* and separately for interconnecting contact points of the right connector of module 1002*f* and the right connector of module 1002*g*.

To form a string 1000 of BIPV modules 1002*a*-1002*l* interconnected in series, the first and second connectors of adjacent modules are connected. This applies to all modules in string 1000 except two modules that forming the ends of this string and providing electrical connections to the string. These two "end of string" modules are modules 1002*a* and 1002*l*, and each one of these two modules is only connected to one other module. Specifically, a first connector contact point of module 1002*a* is connected to a second connector contact point of module 1002*b*, while a second connector contact point of module 1002*l* is connected to a first connector contact point of module 1002*k*. The second connector contact point of module 1002*a* and the first connector contact point of module 1002*l* are sometimes referred to as "string contact points" and provide electrical connections to string 1000. For example, they can connect to an inverter or some other electrical component of the photovoltaic array. String contact points may be moved into any other physical location along the string. New string contact points are formed by disconnecting any two contact points, which become the new string contact points, and interconnecting (i.e., "jumping") the previous string contact points. For example, any pair of contact points in FIG. 10A shown to be connected may be disconnected to form new string contact points, while the second connector contact point of module 1002*a* and the first connector contact point of module 1002*l* may be interconnected or jumped to a contact point of another module in the array.

Returning to the example illustrated in FIG. 10A, all other modules 1002*b*-1002*k* (that are not providing string contact points) are connected to two adjacent modules. The adjacent modules may be positioned in the same row or in a different row. For example, a first connector contact point of module 1002*b* is connected to a second connector contact point of module 1002*c*, while a second connector contact point of module 1002*b* is connected to a first connector contact point of module 1002*a*. As shown in FIG. 10A, modules 1002*a*, 1002*b*, and 1002*c* are positioned in the same row. Continuing with the connection path, a first connector contact point of module 1002*c* is connected to a second connector contact point of module 1002*d*. As shown in FIG. 10A, modules 1002*c* and 1002*d* are positioned in different rows. Nevertheless, modules 1002*c* and 1002*d* are still considered adjacent modules because they are connected to each other. Similar connections are provided in between other modules and rows.

When two adjacent modules are positioned in the same row, their connector contact point may be connected using field jumpers 1004 and/or integrated jumpers of another module, if such a module is provided in an adjacent row. Modules 1002*a*-1002*c* form a top row and there is no adjacent upper row. As such, modules 1002*a*-1002*c* are interconnected using two field jumpers 1004. Specifically, the first connector contact point of module 1002*b* is connected to the second connector contact point of module 1002*c* using one field jumper 1004, while the second connector contact point of module 1002*b* is connected to the first connector contact point of module 1002*a* using another field jumper 1004.

Modules 1002*d*-1002*f* are positioned in a second row (from the top) and are interconnected using integrated jumpers of modules 1002*a* and 1002*b*. The two jumper contact points of each integrated jumper are interconnected, which provides an electrical connection between the two modules in an adjacent row. Specifically, a first connector contact point of module 1002*d* is connected to a second connector contact point of module 1002*e* by an integrated jumper of module 1002*b*, while the first connector contact point of module 1002*e* is connected to a second connector contact point of module 1002*f* by an integrated jumper of module 1002*a*. For clarity, FIG. 10A illustrates field jumpers and integrated jumpers shifted above the respective connectors. However, in an installed and connected state, these components physically overlap and their respective contact points physically touch and are interconnected.

When two adjacent modules are positioned in different rows, their respective connector contact point may be connected using an edge jumper. Specifically, FIG. 10A illustrates the second connector contact point of module 1002d as connected to the right jumper contact point of module 1002c. At the same time, the first connector contact point of module 1002c is connected to the left jumper contact point of module 1002c using an edge jumper 1006. Since these two jumper contact points are interconnected, the second connector contact point of module 1002d is electrically connected to the first connector contact point of module 1002c, and string 1000 is continued from the first row to the second row. Edge jumpers 1006 are used to interconnect pairs of modules positioned at the ends of two adjacent rows. Such edge connections may alternate from left to right between sets of two rows as shown in FIG. 10A. Specifically, one edge jumper 1006 is used for interconnecting modules 1002c and 1002d as described above. Another edge jumper 1006 is used for connecting the first connector contact point of module 1002f to the right jumper contact point of the jumper of module 1002f and then through this jumper to the second connector contact point of module 1002g and so on.

In certain embodiments, edge jumpers are integrated into BIPV modules. Such modules may be referred to as edge modules and are different from center modules (e.g., modules 1002a and 1002b in FIG. 10A). Furthermore, edge modules may have different polarity orientations depending on which one of the two connector contact points is connected to the two jumper contact points. In the example presented in FIG. 10A, modules 1002c and 1002i would represent one polarity type of edge modules, while module 1002f represents another polarity type of edge modules. Continuing with this example, modules 1002a, 1002b, 1002g, and 1002h represent one polarity type of center modules, while modules 1002d, 1002e, 1002j, 1002k, and 1002l represents another polarity type of center modules.

In other embodiments, an edge field jumper is field installable. This feature allows converting an "edge type" module into a "center type" module (based on distinctions presented in the above example), thereby reducing the number of different types of BIPV modules needed for installation.

In certain embodiments, an edge jumper is integrated into a module but remains disconnected from the two interconnected jumper contact points on the same module prior to installation of the module. If a module is used as a "center type" module, then this edge jumper remains disconnected during and after installation. However, if a module is used as an "edge type" module, then a connection is provided between the integrated edge jumper and two interconnected jumper contact points. This connection may be provided by a field jumper.

Figure 11A:
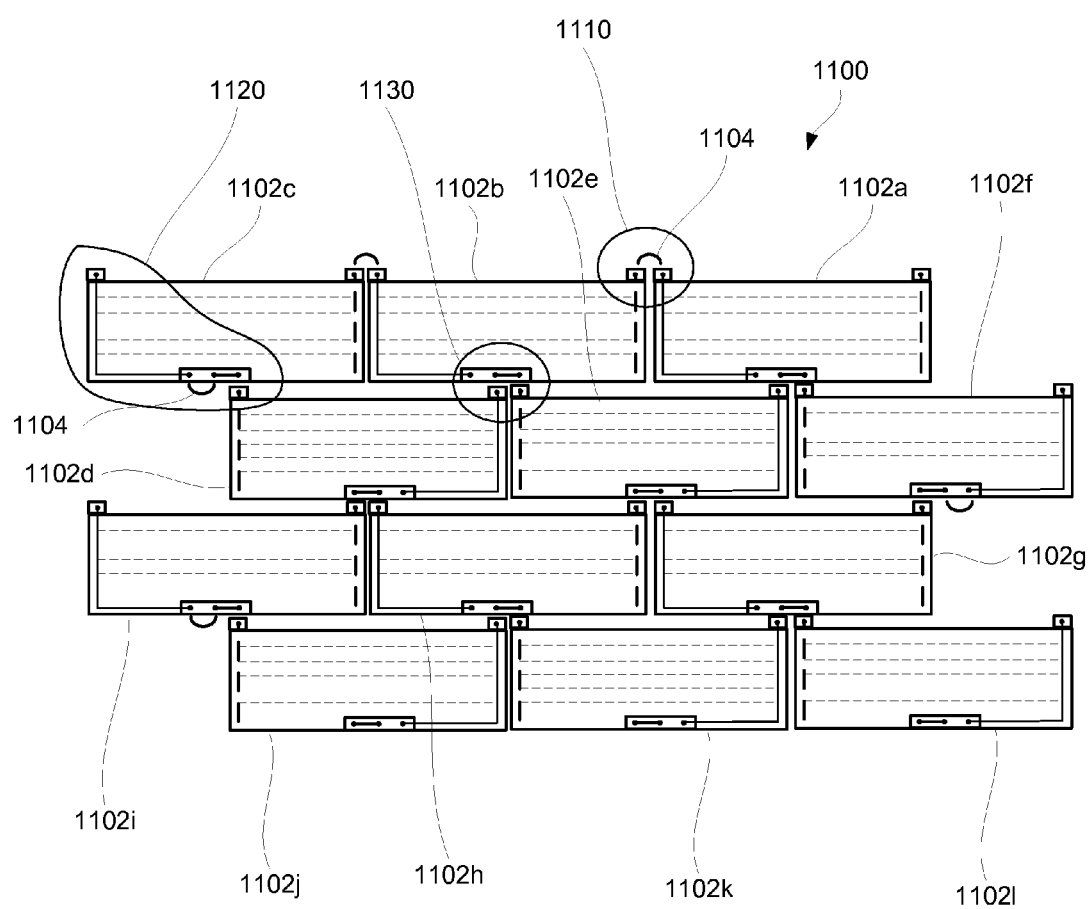
FIG. 11A is a schematic representation of another photovoltaic string including two types of different BIPV modules, in accordance to certain embodiments.

Such configurable modules may include an additional jumper contact point that is connected to one of the connector contact points as, for example, shown in FIG. 11A. In the above example, this connection is provided by the integrated edge jumper, which may be a bus bar or some other connector provided internally within the module, for example, during fabrication of the module. Therefore, separate edge jumpers are not needed, which simplifies installation and provides a more enclosed and robust photovoltaic system. Various features and operation of such configurable modules will be now explained in more detail with reference to FIG. 11A.

FIG. 11A is a schematic representation of a photovoltaic string 1100 assembled from two types of configurable modules 1102a-1102l, in accordance with certain embodiments. These configurable modules differ in their polarity orientation (i.e., modules 1102a-1102c and 1102g-1102i have one polarity orientation, while modules 1102d-1102f and 1102j-1102l have a different polarity orientation). Furthermore, modules 1102c, 1102f, and 1102i have field jumpers 1104 installed between their additional jumper contact points and two interconnected contact points to convert these modules into "edge type" modules. Two modules 1102a and 1102l form ends of string 1100 (i.e., between a second connector contact point of module 1102a and a first connector contact point of module 1102l). Therefore, each one of these modules is only connected to one other module (i.e., module 1102a is connected to module 1102b, while module 1102l is connected to module 1102j).

Similar to the example described above with reference to FIG. 10A, field jumpers 1104 are used for interconnecting pairs of connector contact points of modules 1102a-1102c in the top row. These jumpers may be the same jumper type as the jumpers used for converting modules 1102c, 1102f, and 1102i (i.e., for interconnecting jumper contact points of modules 1102c, 1102f, and 1102i).

Figure 11B:
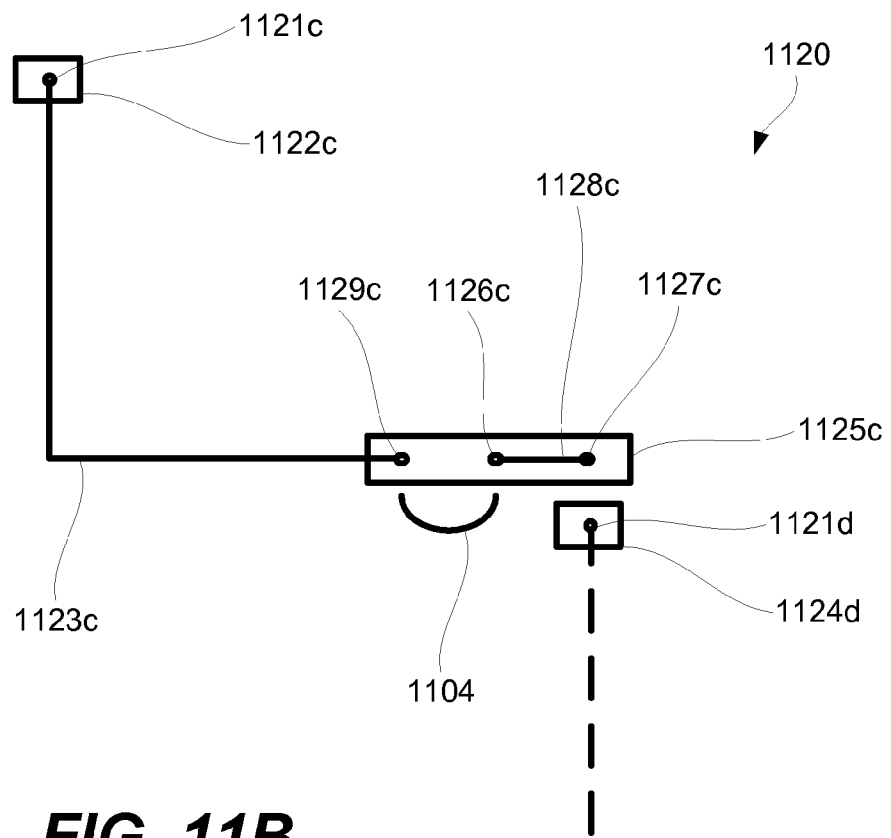
FIG. 11B is a schematic representation of a portion of the photovoltaic string shown in FIG. 11A illustrating use of an integrated jumper and field jumper for interconnecting two contact points of modules positioned in adjacent rows, in accordance to certain embodiments.

FIG. 11A shows three portions 1110, 1120, and 1130 of photovoltaic string 1100 having different connection schemes. A connection between contact points of two adjacent connectors using a field jumper, which is shown within portion 1110, is similar to the one described above with reference to FIG. 10B. Portions 1120 and 1130 have somewhat different connections schemes and are described below with reference to FIGS. 11B and 11C. FIG. 11B is a schematic representation of portion 1120 of photovoltaic string 1100 illustrating use a combination of field jumper 1104 and integrated jumper 1125c for interconnecting contact points 1121c and 1121d, in accordance to certain embodiments. Contact point 1121d is a part of left connector 1124d of module 1102d, and it has the second polarity. Contact point 1121c is a part of right connector 1122c of module 1102c, and it has the first polarity. Modules 1102d and 1102c are end modules positioned in adjacent rows as show in FIG. 11A.

Module 1102c includes connecting lead 1123c which interconnects contact point 1121c of connector 1122c with contact point 1129c of integrated jumper 1125c. Field jumper 1104 is used to interconnect contact points 1129c and 1126c of integrated jumper 1125c. Furthermore, integrated jumper 1125c is provided with its contact points 1126c and 1127c interconnected using jumper lead 1128c. Therefore, adding field jumper 1104 effectively interconnects contact point 1121c of connector 1122c and contact point 1127c of integrated jumper 1125c. At the same time, contact point 1121d of connector 1124d and contact point 1127c of integrated jumper 1125c are electrically connected during installation of the array, thereby interconnecting contact points 1121c and 1121d. For clarity, field jumper 1104 is schematically shown separated form integrated jumper 1125c, while integrated jumper 1125c is schematically shown separated from connector 1124d. However, in the connected states, three electrical connections are provided between their respective contact points as explained above.

Similar connection schemes are used for interconnecting contact points of the left connector of module 1102i and the left connector of module 1102j and separately for interconnecting contact points of the right connector of module 1102f and the right connector of module 1102g.

Figure 11C:
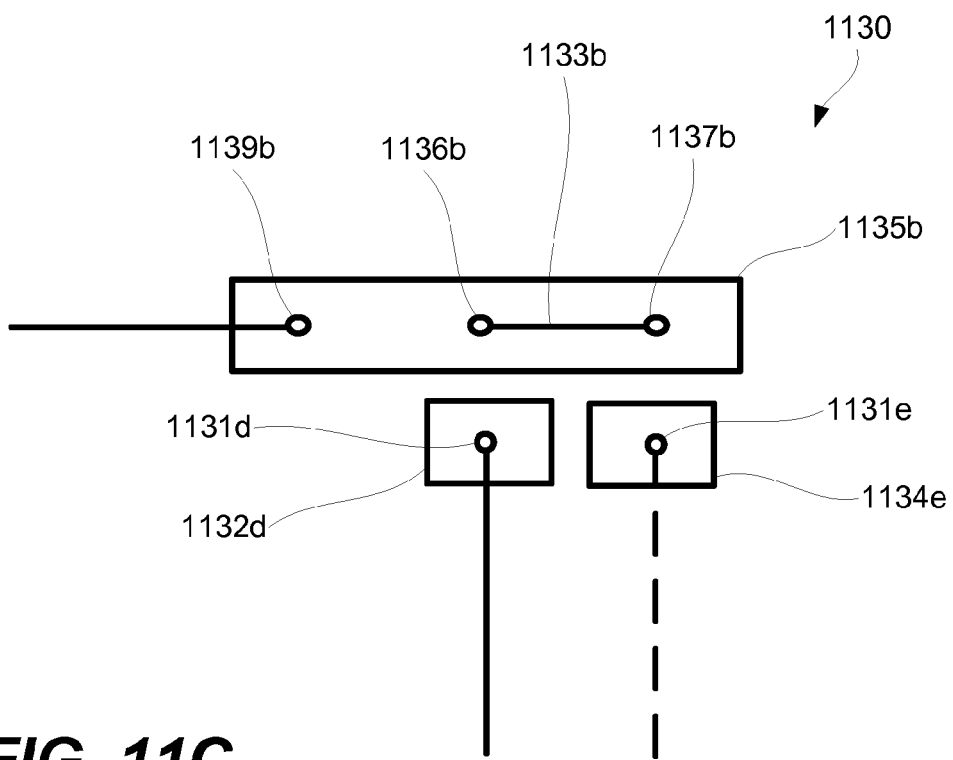
FIG. 11C is a schematic representation of another portion of the photovoltaic string shown in FIG. 11A illustrating use of an integrated jumper for interconnecting two contact points of two adjacent modules, in accordance to certain embodiments.

FIG. 11C is a schematic representation of portion 1130 of photovoltaic string 1100 illustrating use of integrated jumper 1135b of module 1102b for interconnecting contact points 1131d and 1131e (and thus modules 1102e and 1102d) in accordance to certain embodiments. Contact point 1131e is a part of left connector 1134e of module 1102e, and it has the second polarity. Contact point 1131d is a part of right connector 1132*d* of module 1102*d*, and it has the first polarity. Modules 1102*e* and 1102*d* are positioned adjacent to each other as shown in FIG. 11A.

Integrated jumper 1135*b* of module 1102*b* provides in series electrical connections between modules 1102*e* and 1102*d*. Contact point 1136*b* of integrated jumper 1135*b* makes an electrical connection to contact point 1131*d* of connector 1132*d*, while contact point 1137*b* of integrated jumper 1135*b* makes an electrical connection to contact point 1131*e* of connector 1134*e*. Interconnected jumper 1135*b* is provided with contact points 1136*b* and 1137*b* interconnected by jumper lead 1133*b*. Therefore, during installation, contact points 1131*d* and 1131*e* become interconnected.

For clarity integrated jumper 1135*b* is shown schematically separated from connectors 1132*d* and 1134*d*, i.e., it is shifted upward. However, in the connected state, contact point 1136*b* of integrated jumper 1135*b* is electrically connected to contact point 1131*d* of connector 1132*d*, and contact point 1137*b* of integrated jumper 1135*b* is electrically connected to contact point 1131*e* of connector 1134*e*. Similar connection schemes are used for interconnecting contact points of the left connector of module 1102*f* and the right connector of module 1102*e*, between the left connector of module 1102*g* and the right connector of module 1102*h*, between the left connector of module 1102*h* and the right connector of module 1102*i*, between the left connector of module 1102*l* and the right connector of module 1102*k*, and between the left connector of module 1102*k* and the right connector of module 1102*j*.

Each of configurable modules 1102*a*-1102*l* has an integrated jumper with three jumper contact points. Two of these contact points are interconnected and are used for making electrical connections and interconnecting pairs of connector contact points of other modules positioned in an adjacent row. An additional jumper contact point (i.e., a third jumper contact point) is connected to one of the connector contact points of this module. The polarity of this connector contact point can determine the type of the module. In the above example, modules 1102*a*-1102*c* and 1102*g*-1102*i* have one polarity orientation, while modules 1102*d*-1102*f* and 1102*j*-1102*l* have a different polarity orientation. The third jumper contact point may be provided at the end of the integrated jumper that is closest to the connector contact point to which this third jumper contact point is connected to. The two interconnected jumper contact points may be centered with respect to the second edge of the photovoltaic portion. However, other mechanical arrangements of these three jumper contact points are possible as well.

As indicated above, BIPV modules may be provided with their third jumper contact points disconnected from the other two interconnected jumper contact points. Modules 1102*b*, 1102*c*, 1102*d*, 1102*e*, 1102*g*, 1102*h*, and 1102*j*-1102*l* may be installed into an array in such a way (i.e., with the third jumper contact points remaining disconnected from the other two jumper contact points). The third jumper contact points in these modules are not connected to any other contact points in the array and there is no current flow through these third contact points.

Edge modules 1102*c*, 1102*f*, and 1002*i* have their third jumper contact points connected to the two other interconnected jumper contact points. This connector may be provided by field jumpers 1104 or some other connection options. In certain embodiments, an integrated jumper has a switch allowing for connecting or disconnecting its third jumper contact point from the two other ones. This switch may be externally adjusted by an installer or may automatically adjust, depending on the number of connector contact points connected to the jumper. As shown in FIG. 11A, edge modules 1102*c*, 1102*f*, and 1002*i* have only one module or, more specifically, only one connector contact point contacting their jumpers. On the other hand, center modules 1102*b*, 1102*c*, 1102*d*, 1102*e*, 1102*g*, 1102*h*, and 1102*j*-1102*l* have two modules or, more specifically, two connector contact points contacting their jumpers. The jumper switch may detect this number of connector contact points contacting the jumper and adjust a connection to the third jumper contact point accordingly. Regardless of connection types between the third jumper contact point and two other interconnected jumper contact points, this connection may be changed in the field in order to convert a "center type" BIPV module into an "edge type" BIPV module and vice versa.

Figure 12A:
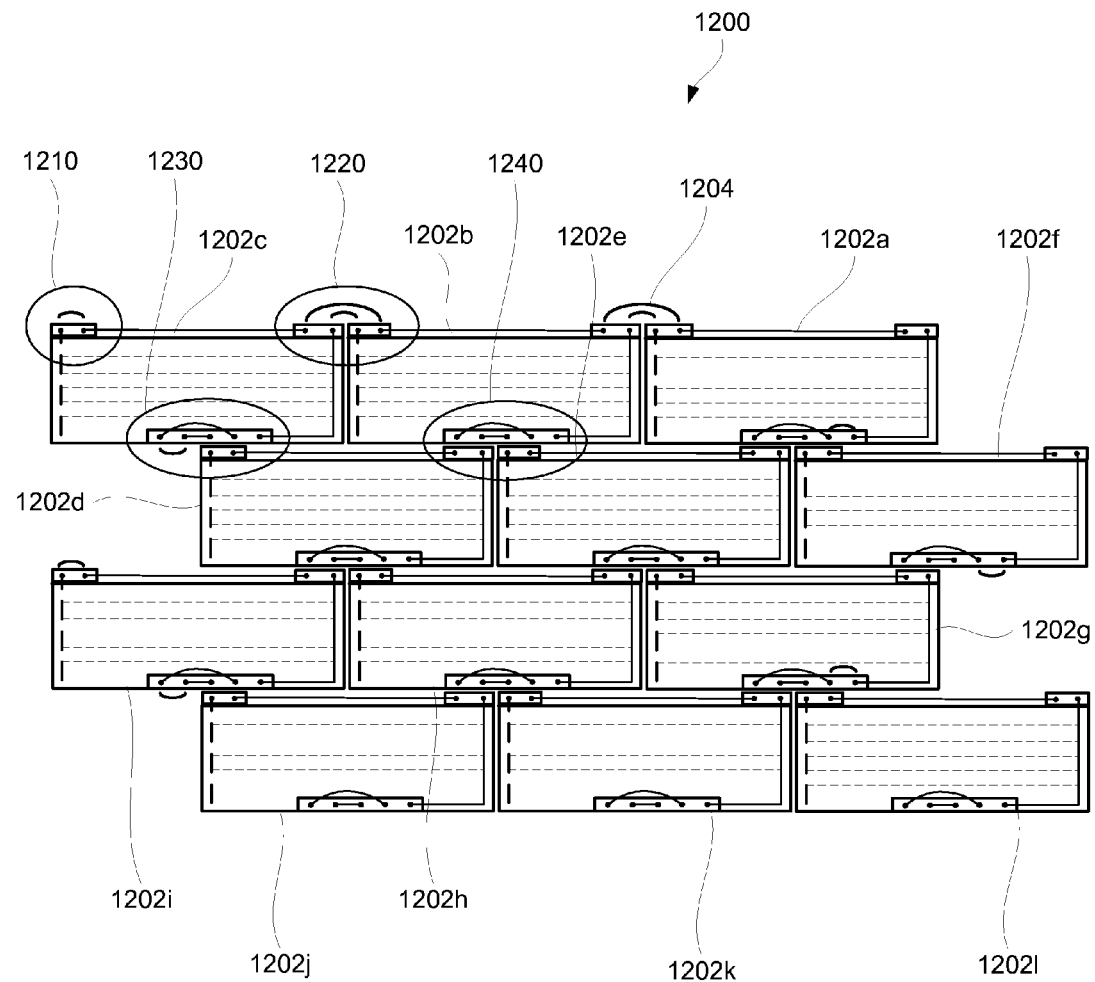
FIG. 12A is a schematic representation of a photovoltaic string including one type of BIPV module, in accordance to certain embodiments.

In some embodiments, module designs are provided that may eliminate a need for modules having different polarity types. As such, an entire array having multiple rows may be installed using only one module type. In some embodiments, BIPV modules are provided with an integrated return path. With the ends of two adjacent rows at the same polarity during installation, the return path can be provided across one row to form an in series connection between the two adjacent rows. FIG. 12A illustrates one example of such modules 1202*a*-1202*l* arranged into a string 1200, in accordance with certain embodiments. Modules 1202*a*-1202*l* still each have two connectors, but now each of the two connectors has two contact points. One of these contact points is connected to the one or more photovoltaic cells and may be referred to as "a cell connector contact point," while another of these contact points is connected to a connecting line extending between the two connectors and may be referred to as "a return connector contact point." Prior to installation of a module, its two return connector contact points are interconnected but are not connected to other electrical components of the module, such as photovoltaic cells. After installation, return connector contact points are interconnected with corresponding return connector contact points of adjacent modules in the same row forming a return path along the row between two end modules of this row.

Integrated jumpers of modules 1202*a*-1202*l* include five jumper contact points. One interconnected pair of these five jumper contact points is used for connecting to cell connector contact points of one or two modules in an adjacent row. This connection is similar to the ones described above with reference to FIGS. 10 and 11. Returning to FIG. 12A, this pair of jumper contact points is represented by the second and third jumper contact points (from the left) on the integrated jumpers. However, one having ordinary skill in the art would understand that other positions and orientations of various jumper contact points are possible. Another interconnected pair of these five jumper contact points is used for connecting to the return connector contact points of one or two modules in an adjacent row (i.e., the same one or two modules to which the first interconnected pair makes connections). This second pair of jumper contact points is a part of the return path and represented by the first and fourth jumper contact points (from the left) on the integrated jumpers. The remaining fifth jumper contact point is connected to one of the cell connector contact points of the same module. In FIG. 12A, the fifth jumper contact point is shown connected to the first cell connector contact point (represented by the solid line). The connection between the fifth jumper contact point and one of the cell connector contact points serves as an edge jumper.

Certain connections between contact points illustrated in FIG. 12A will now be explained in more detail, with further explanation provided below with respect to FIGS. 12B-12E.

In FIG. 12A, a top row of string 1200 includes modules 1202a-1202c. Each pair of these modules is interconnected using two field jumpers 1204, which may be integrated into a single mechanical component or be two separate components. One jumper (i.e., a smaller inner jumper shown in FIG. 12A) is used to connect two corresponding cell connector contact points. Another jumper (i.e., a larger outer jumper shown in FIG. 12A) is used to connect two corresponding return connector contact points to form a return path. Module 1202c is an end module in this row and includes a single field jumper connecting return and cell connector contact points of the left connector. As a result, a second connector contact point (represented by the dashed line) of module 1202c is connected to the return path and form as one string contact point. Therefore, one connection to string 1200 may be made anywhere along this return path (e.g., at the left cell connector contact point of module 1202c or any return connector contact points of modules 1202a, 1202b, and 1202c). If this connection is made to the left cell connector contact point of module 1202c, then outer field jumpers interconnecting return connector contact points of modules 1202a, 1202b, and 1202c may be eliminated.

Integrated jumpers of modules 1202a and 1202b are used for interconnecting cell connector contact points and return connector contact points of modules 1202d-1202f similar to a combination of two field jumpers described above. Specifically, the integrated jumper of module 1202a forms two separate electrical connections between two sets of connector contact points of modules 1202e and 1202f. Second and third (from the left) jumper contact points of module 1202a interconnect corresponding cell connector contact points of modules 1202e and 1202f. First and fourth (from the left) jumper contact points of module 1202a interconnect corresponding connector contact points of modules 1202e and 1202f. Similar connections are provided by the integrated jumper of module 1202e for connector contact points of modules 1202d and 1202e. A similar connection scheme is provided between the third and fourth rows such that modules 1202g-1202i are interconnected in series and provide a return path, and modules 1202j-1202l are interconnected in series and provide their own return path. Integrated jumpers of modules 1202j-1202l (i.e., modules in the last row) are not used for any connections in this example. Module 1202l includes another end of string 1200 represented by the first connector contact point of module 1202l. Since this connector contact point is also connected to the fifth jumper contact point of the same module, either one or both of these contact points may be used as an end of the string.

To form an electrical connection between the first and second rows, two field jumpers are provided between the first and second (from the left) jumper contact points of module 1202d and between the fourth and fifth (from the left) jumper contact points of module 1202a. These two jumpers, in a combination with a return path of the second row, ensure connection between terminals having opposite polarities represented by a solid line of module 1202a and a dashed line for module 1202d. Specifically, the first connector contact point and the fifth jumper contact point of module 1202a may be interconnected during fabrication of the module. The fourth and fifth jumper contact points of module 1202a may be interconnected in the field using a field jumper. The fourth field jumper is a part of the return path provided by the return connector contact points and lines of modules 1202e and 1202d. These return connector contact points are interconnected by integrated jumpers of modules 1202a and 1202b. The left return connector contact point of module 1202d is connected to the fourth jumper contact point of module 1202c, which in turn is connected to the first jumper contact point of the same module. The first and second jumper contact points are interconnected by a field jumper, while the second and third jumper contact points are interconnected in that jumper during fabrication. As such, the left four jumper contact points of module 1202d are all interconnected during and after installation. The third jumper contact point is connected to the second connector contact point of module 1202d, which means that this connector contact point is connected by the return path to the first connector contact point of module 1202a, thereby interconnecting modules 1202a and 1202c in series.

A similar connection scheme is provided between the second and third rows such that the first connector contact point of module 1202f is connected to the second connector contact point of module 1202i; therefore, modules 1202f and 1202i are also interconnected in series. Furthermore, the first connector contact point of module 1202g is connected to the second connector contact point of module 1202j, which means that modules 1202g and 1202j are also interconnected in series.

As shown in FIG. 12A, contact points of modules 1202a and 1202l represent the ends of string 1200. However, if these contact points are interconnected, any other two contact points may be disconnected (e.g., by removing a field jumper) to provide the ends of string 1200 in different locations. For example, additional lines may be provided within modules for interconnecting contact points of modules 1202a and 1202l. In a specific example, an additional pair of interconnected contact points may be provided such that one point in this pair is provided on the integrated jumper while another point is provided on one of the connectors. This interconnected pair represents a portion of the vertical return path and may be connected to one or more modules in adjacent rows.

Figure 12B:
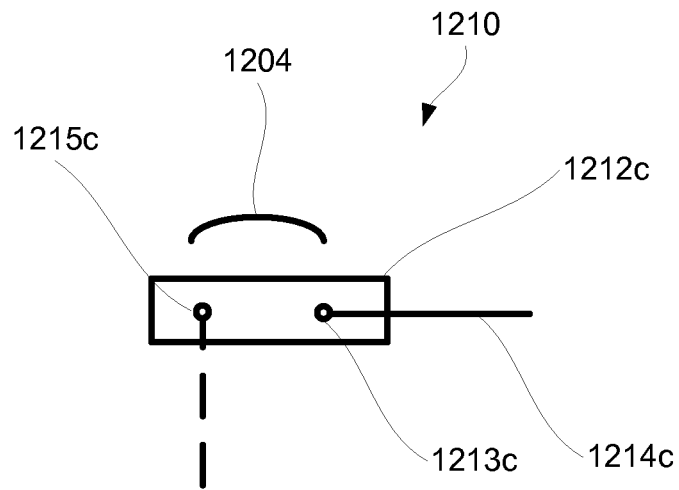
FIG. 12B is a schematic representation of a portion of the photovoltaic string shown in FIG. 12A illustrating use of a single-lead field jumper for interconnecting two contact points of the same connector of the end module, in accordance to certain embodiments.

FIG. 12A shows four portions 1210, 1220, 1230, and 1240 of photovoltaic string 1200 having different connection schemes, which will now be described with reference to FIGS. 12B-12E. FIG. 12B is a schematic representation of portion 1210 illustrating use of a single-lead field jumper 1204 for interconnecting contact points 1213c and 1215c of connector 1212c of module 1202c, in accordance to certain embodiments. Connector 1212c is the left connector of module 1202c, and it has two contact points 1213c and 1215c. Contact point 1215c is connected to the photovoltaic cells of module 1202c and has the second polarity. Contact point 1213c is connected by lead 1214c to a contact point of the right connector of module 1202c (not shown in FIG. 12B). In order to form a return line in the top row, contact points 1213c and 1215c are interconnected using field jumper 1204. For clarity, field jumper 1204 is shown separated from connector 1212c. However, in the connected state, contact points 1213c and 1215c are connected to and interconnected by field jumper 1204. A similar connection scheme is used for the left connector of module 1202i.

Figure 12C:
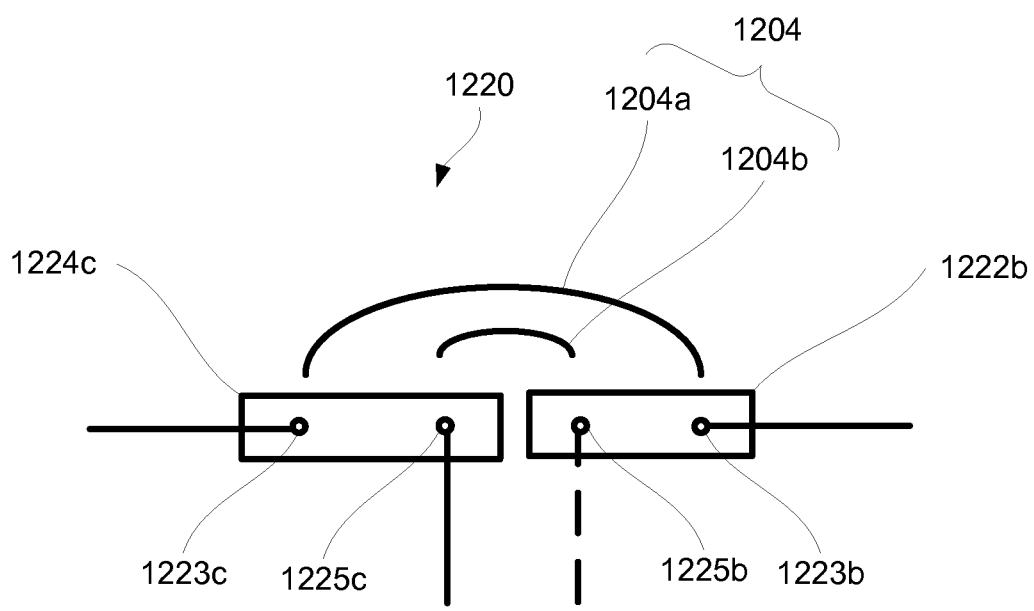
FIG. 12C is a schematic representation of another portion of the photovoltaic string shown in FIG. 12A illustrating use of a double-lead field jumper for independently interconnecting two sets of contact points of two adjacent modules positioned in the same row, in accordance to certain embodiments.

FIG. 12C is a schematic representation of a portion 1220 of photovoltaic string 1200 illustrating use of a double-lead field jumper 1204 for interconnecting two sets of contact points, i.e., interconnecting contact points 1223c and 1223b and separately interconnecting contact points 1225c and 1225b, in accordance to certain embodiments. Contact points 1223c and 1225c are parts of left connector 1224c of module 1202c, while contact points 1223b and 1225b are parts of right connector 1222b of module 1202b. Contact point 1225c is connected to the photovoltaic cells of module 1202c and has the first polarity. Contact point 1223c is connected to a similar contact point of the left connector of module 1202c (not shown in FIG. 12C). Contact point 122bc is connected to the photovoltaic cells of module 1202b and has the second polarity. Contact point 1223b is connected to a similar contact point of the right connector of module 1202b (not shown in FIG. 12C).

Double-lead field jumper 1204 accomplishes two roles when attached to connectors 1224c and 1222b. First, it forms a return line when lead 1204a interconnects contact points 1223c and 1225b. Second, it connects two modules in series when lead 1204b interconnects contact points 1225c and 1225b. While field jumper 1204 is shown separated form contact points 1223c, 1225c, 1223b, and 1225b, in the connected state, field jumper 1204 forms mechanical and electrical connections with these contact points. A similar connection scheme is used for connecting the left connector of module 1202a to the right connector of module 1202b.

Figure 12D:
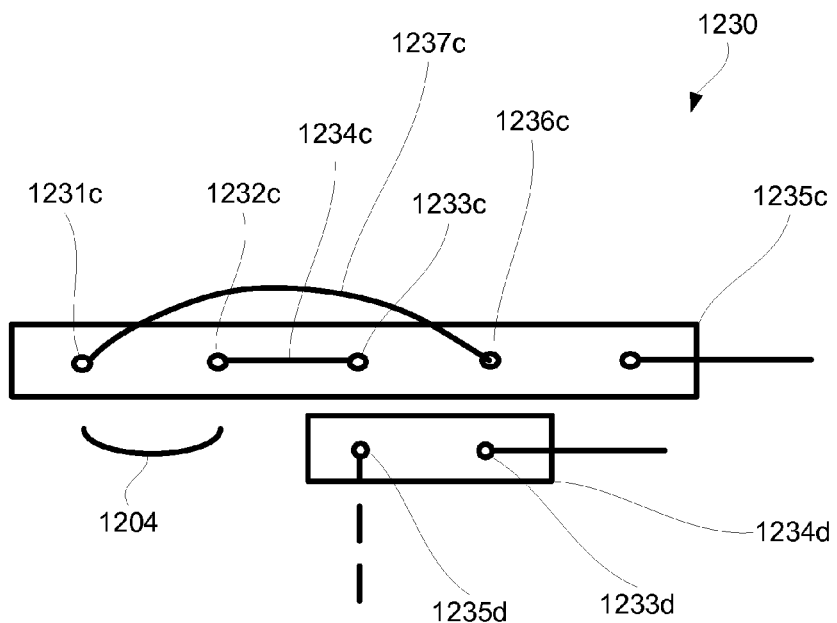
FIG. 12D is a schematic representation of yet another portion of the photovoltaic string shown in FIG. 12A illustrating use of an integrated jumper and field jumper for interconnecting two contact points of the same connector of the end module, in accordance to certain embodiments.

FIG. 12D is a schematic representation of a portion 1230 of photovoltaic string 1200 illustrating use of an integrated jumper 1235c of module 1202c and a field jumper 1204 for interconnecting contact points 1235d and 1233d of left connector 1234d of module 1202d, in accordance to certain embodiments. Contact point 1235d is connected to the photovoltaic cells of module 1202d and has the second polarity. Contact point 1233d is connected to a similar contact point of the right connector of module 1202d (not shown in FIG. 12D).

Interconnecting contact points 1231c and 1232c with field jumper 1204 effectively interconnects contact points 1233c and 1236c on this integrated jumper 1235c. As shown, contact points 1231c and 1236c are provided interconnected with one jumper lead 1237c, while contact points 1232c and 1233c are provided interconnected with another jumper lead 1234c. Therefore, an assembly including field jumper 1204 and integrated jumper 1235c is used for interconnecting contact points 1235d and 1233d of connector 1234d. For clarity, field jumper 1204 is shown separated form contact points 1231c and 1232c and integrated jumper 1235c is shown separated from connector 1234c. However, in the connected state, field jumper 1204 forms mechanical and electrical connections with contact points 1231c and 1232c while contact point 1233c is electrically connected to contact point 1235d and contact point 1236c is connected to contact point 1233d. Similar connection schemes are used for interconnecting contact points of the left connector of module 1202j and for interconnecting contact points of the right connector of module 1202g.

Figure 12E:
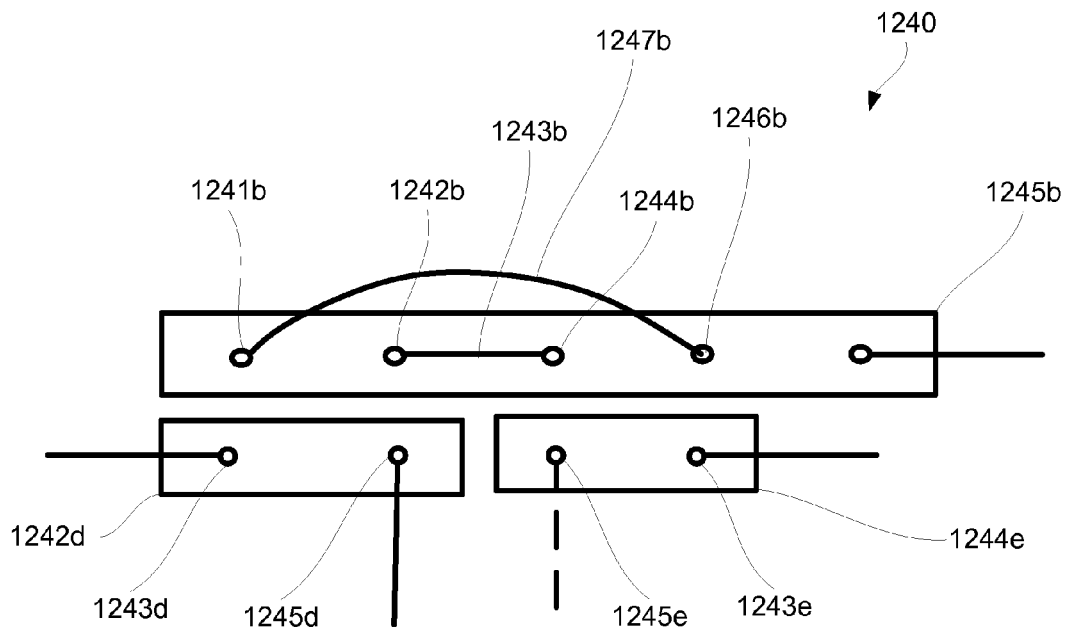
FIG. 12E is a schematic representation of yet another portion of the photovoltaic string shown in FIG. 12A illustrating use of an integrated jumper for independently interconnecting two sets of contact points of two adjacent modules positioned in the same row, in accordance to certain embodiments.

FIG. 12E is a schematic representation of a portion 1240 of photovoltaic string 1200 illustrating use of an integrated jumper 1245b for interconnecting two sets of contact points, i.e., interconnecting contact points 1243d and 1243e and separately interconnecting contact points 1245d and 1245e, in accordance to certain embodiments. Contact points 1243d and 1245d are parts of right connector 1242d of module 1202d, while contact points 1245e and 1243e are parts of left connector 1244e of module 1202e. Contact point 1245d is connected to the photovoltaic cells of module 1202d and has the first polarity. Contact point 1243d is connected to a similar contact point of the right connector of module 1202d (not shown in FIG. 12E). Contact point 1245e is connected to the photovoltaic cells of module 1202e and has the second polarity. Contact point 1243e is connected to a similar contact point of the left connector of module 1202e (not shown in FIG. 12e).

Integrated jumper 1245b of module 1202b accomplishes two roles when attached to connectors 1242d and 1244e. First, it forms a return line when contact points 1241b and 1246b, which are part of integrated jumper 1245b and interconnected with jumper lead 1247b, are connected to contact points 1243d and 1243e, respectively, thereby interconnecting contact points 1243d and 1243e. Second, integrated jumper 1245b connects two modules in series when contact points 1242b and 1244b, which are part of integrated jumper 1245b and interconnected with jumper lead 1243b, are connected to contact points 1245d and 1245e, respectively, thereby interconnecting contact points 1245d and 1245e. For clarity, integrated jumper 1245b is shown separated form connectors 1242d and 1244e. However, in the connected state, contact point 1241b is connected to contact point 1243d, contact point 1242b is connected to contact point 1245d, contact point 1244b is connected to contact point 12445e, and contact point 1246b is connected to contact point 1243e. Similar connection schemes are used for making electrical connections between the left connector of module 1202f and the right connector of module 1202e, between the left connector of module 1202g and the right connector of module 1202h, between the left connector of module 1202h and the right connector of module 1202i, between the left connector of module 1202l and the right connector of module 1202k, and between the left connector of module 1202k and the right connector of module 1202j.

Provided also are various process examples for installing a photovoltaic string on a building structure. As stated above, the photovoltaic string is used for electricity generation and for protecting the building structure from the environment. One building structure may include one or more photovoltaic strings forming a photovoltaic array. When multiple strings are used, each string may be connected to a separate inverter or some other electrical components of the array.

Figure 13:
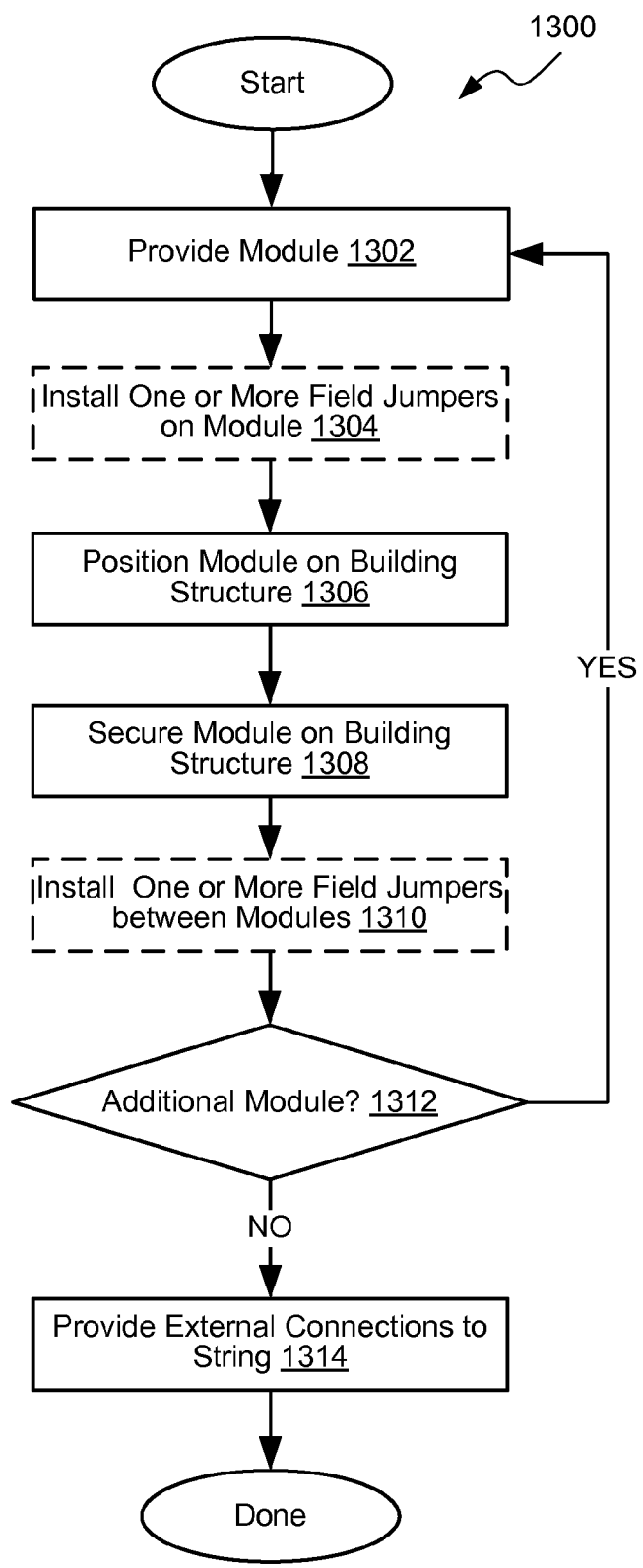
FIG. 13 is a flow chart corresponding to a process of forming a photovoltaic string on a building structure, in accordance with certain embodiments.

FIG. 13 is a flow chart illustrating various operations of process 1300 for installing a photovoltaic string on a building structure, in accordance with certain embodiments. Process 1300 may start with providing a BIPV module in operation 1302. This operation may also involve the selection of a particular type of module if multiple types of modules are used (e.g., based on polarity and/or other features). Various examples of BIPV modules are described above.

Process 1300 may proceed with installing one or more field jumpers in optional operation 1304. As described above with reference to FIGS. 10-12, some modules may not receive any field jumpers. All necessary connections among various contact points of these modules are provided during their fabrication. For example, modules in the first installed row (i.e., the bottom row) generally do not receive any field jumpers. Other modules may receive one or more jumpers in the field. For example, module 1002c shown in FIG. 10A has an edge jumper installed, while module 1102c in FIG. 11A has a field jumper interconnecting its first and second (from the left) jumper contact points. Some more complex module designs may require installation of multiple jumpers on some modules. For example, module 1202c shown in FIG. 12A has two field jumpers installed. One jumper interconnects the left cell and return connector contact points, while another jumper interconnects the first and second (from the left) jumper contact points. Jumpers installed on a single module in this operation may be the same as the jumpers installed between two adjacent modules in operation 1310 (further described below). In certain embodiments, jumpers used for interconnecting certain contact points of this module are different than jumpers installed between two adjacent modules (i.e., jumpers used to interconnect contact points of the two different modules).

Process 1300 may proceed with positioning the module on a building structure in operation 1306. In certain embodiments, this operation may also involve establishing electrical connections between the module in question and one or more other modules already positioned on the building structure.

For example, two modules may be already installed on the building structure and positioned in the same row. When another module is positioned in an adjacent row during operation 1306, its integrated jumper may interconnect the two previously installed modules. More specifically, during positioning of a module in an adjacent row, two interconnected jumper contact points of the module may form electrical connections with connector contact points of the two previously installed modules such that the photovoltaic cells of the two modules become electrically connected.

In certain embodiments, connectors of the previously installed modules and an integrated jumper of the new module (i.e., the module positioned in operation 1306) are used for aligning the new module with respect to the installed modules. However, other aligning features may be used as well. A combination of the connectors and jumper or separate aligning features may include interlocking features to retain the positioned module with respect to the previously installed modules, at least during operation 1306. This may help with handling the modules during installation and eliminate a need for constant support of the modules.

Process 1300 may then involve securing the positioned module to the building structure in operation 1308. The module may be secured using mechanical fasteners (e.g., nails, screws, staples). In specific embodiments, a moisture flap of the module is nailed to roofing boards, such as plywood.

Process 1300 may also involve installing one or more field jumpers in between modules in operation 1310. Generally, such field jumpers are installed in the last (top) row of the string. If additional modules need to be installed, as reflected by decision block 1312, then operations 1302-1310 are repeated until all modules in the string are secured on the building structure and electrically connected to each other.

Finally, in operation 1314, process 1300 may involve providing external connections to the string. For example, an inverter or other electrical component may be connected to the string ends. In certain embodiments, operation 1314 may also involve creating new ends. In this situation, original ends of the strings are interconnected, while another connection in the string loop is opened to define new string ends.

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

The invention claimed is:

1. A building integrable photovoltaic module for installation into a photovoltaic array, the building integrable photovoltaic module comprising:
   a photovoltaic portion comprising one or more photovoltaic cells having a first edge and a second edge opposite to the first edge;
   a flap portion attached to the photovoltaic portion along the first edge;
   a first connector attached to a front side of the flap portion adjacent to the first edge, the first connector comprising a first connector contact point;
   a second connector attached to the front side of the flap portion adjacent to the first edge, the second connector comprising a second connector contact point, wherein the first connector contact point and the second connector contact point are electrically connected to the one or more photovoltaic cells and have different polarities; and
   an integrated jumper attached to a back side of the photovoltaic portion adjacent to the second edge, the jumper comprising two interconnected jumper contact points configured to establish electrical connections with two connector contact points of two adjacent building integrable photovoltaic modules provided in an adjacent row during installation of the photovoltaic array.

2. The building integrable photovoltaic module of claim 1, wherein the first connector and the second connector are positioned adjacent to opposite ends of the first edge.

3. The building integrable photovoltaic module of claim 1, wherein the integrated jumper is positioned substantially in a middle of the second edge.

4. The building integrable photovoltaic module of claim 1, wherein the first connector comprises a socket enclosing the first connector contact point, and wherein the socket extends substantially perpendicular to the front side of the flap portion.

5. The building integrable photovoltaic module of claim 1, wherein the first connector comprises a socket enclosing the first connector contact point and wherein the socket extends substantially parallel to the front side of the flap portion.

6. The building integrable photovoltaic module of claim 1, wherein the integrated jumper comprises interlocking features for interlocking with connectors of the two adjacent building integrable photovoltaic modules provided in the adjacent row during installation of the photovoltaic array.

7. The building integrable photovoltaic module of claim 1, wherein the first connector contact point is electrically connected to the two interconnected jumper contact points of the integrated jumper.

8. The building integrable photovoltaic module of claim 1, wherein a material of the integrated jumper is substantially more flexible than a material of the back side of the photovoltaic portion.

9. The building integrable photovoltaic module of claim 8, wherein the integrated jumper comprises one or more of the following materials: polyethylene, polypropylene, thermoplastic olefins, thermoplastic rubber, thermoplastic elastomer, ethylene propylene diene monomer, fluoro-elastomer, and thermoplastic vulcanizate.

10. The building integrable photovoltaic module of claim 1, wherein the two interconnected jumper contact points are movable with respect to each other at least along the second edge.

11. The building integrable photovoltaic module of claim 1, wherein the first connector is movable with respect to the second connector at least along the first edge.

12. The building integrable photovoltaic module of claim 1, wherein the first connector contact point comprises a louvered metal strip positioned within a cavity of the first connector.

13. The building integrable photovoltaic module of claim 1, wherein the integrated jumper further comprises a third jumper contact point, the third jumper contact point being electrically connected to the first connector contact point of the first connector.

14. The building integrable photovoltaic module of claim 13, wherein the third jumper contact point is electrically insulated from the interconnected jumper contact points.

15. The building integrable photovoltaic module of claim 13, wherein the first connector further comprises a first return connector contact point and the second connector further comprises a second return connector contact point electrically connected to the first return connector contact point.

16. The building integrable photovoltaic module of claim 15, wherein the integrated jumper further comprises two return jumper contact points electrically connected to each other and configured to establish electrical connections to two return connector contact points of the two adjacent building integrable photovoltaic modules provided in the adjacent row during installation of the photovoltaic array.

17. The building integrable photovoltaic module of claim 16, wherein the two return jumper contact points are electrically connected to the third jumper contact point.

18. The building integrable photovoltaic module of claim 15, wherein the first return connector contact point is electrically connected to the first connector contact point.

* * * * *